United States Patent
Yoshinaga

(10) Patent No.: US 10,444,559 B2
(45) Date of Patent: Oct. 15, 2019

(54) DISPLAY UNIT AND ELECTRONIC APPARATUS

(71) Applicant: SONY CORPORATION, Tokyo (JP)

(72) Inventor: Tadahiko Yoshinaga, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/512,062

(22) PCT Filed: Sep. 14, 2015

(86) PCT No.: PCT/JP2015/075959
§ 371 (c)(1),
(2) Date: Mar. 16, 2017

(87) PCT Pub. No.: WO2016/052152
PCT Pub. Date: Apr. 7, 2016

(65) Prior Publication Data
US 2017/0276997 A1     Sep. 28, 2017

(30) Foreign Application Priority Data
Oct. 1, 2014    (JP) ................. 2014-203136

(51) Int. Cl.
    H01L 51/50     (2006.01)
    G02F 1/1335    (2006.01)
    (Continued)

(52) U.S. Cl.
    CPC ...... G02F 1/133514 (2013.01); G02F 1/1335 (2013.01); G09G 3/3233 (2013.01);
    (Continued)

(58) Field of Classification Search
CPC ............ G02F 1/133514; G02F 1/1335; G02F 2201/52; G09G 3/3607; H01L 27/322
See application file for complete search history.

(56) References Cited

U.S. PATENT DOCUMENTS

2005/0225233 A1* 10/2005 Boroson .............. H01L 27/322
                                                                   313/504
2007/0205423 A1* 9/2007 Yamazaki .......... H01L 27/3213
                                                                   257/89

(Continued)

FOREIGN PATENT DOCUMENTS

JP     2006-058604 A     3/2006
JP     2008-225179 A     9/2008
(Continued)

*Primary Examiner* — Donald L Raleigh
(74) *Attorney, Agent, or Firm* — Chip Law Group

(57) ABSTRACT

A first display unit according to the disclosure includes a first pixel and a second pixel each having a light emitting layer, and a color filter layer disposed to face the first pixel and the second pixel. The color filter layer has a plurality of regions at a position facing at least the first pixel. The plurality of regions vary in optical transmittance. A second display unit according to the disclosure includes a first pixel and a second pixel each having a plurality of sub-pixels, and a color filter layer disposed to face the first pixel and the second pixel, and having a plurality of color regions having an arrangement of colors in units of the sub-pixels. At least one of the sub-pixels that correspond to a color arrangement configuration of the color regions that face the first pixel is different, in optical transmittance, from corresponding one of the sub-pixels that correspond to a color arrangement configuration of the color regions that face the second pixel.

17 Claims, 13 Drawing Sheets

(51) Int. Cl.
   *H05B 33/12*    (2006.01)
   *G09G 3/36*     (2006.01)
   *H01L 27/32*    (2006.01)
   *H01L 51/56*    (2006.01)
   *G09G 3/3233*   (2016.01)
   *G09G 3/20*     (2006.01)

(52) U.S. Cl.
   CPC ......... *G09G 3/3607* (2013.01); *H01L 27/322* (2013.01); *H01L 27/3213* (2013.01); *H01L 51/5012* (2013.01); *H01L 51/56* (2013.01); *H05B 33/12* (2013.01); *G02F 2201/52* (2013.01); *G09G 3/2003* (2013.01); *G09G 2300/0426* (2013.01); *G09G 2300/0452* (2013.01); *G09G 2300/0842* (2013.01)

(56) References Cited

U.S. PATENT DOCUMENTS

| | | | | |
|---|---|---|---|---|
| 2008/0224968 | A1* | 9/2008 | Kashiwabara | G09G 3/2003 345/83 |
| 2008/0231554 | A1* | 9/2008 | Lee | H01L 27/3216 345/63 |
| 2008/0316235 | A1* | 12/2008 | Okazaki | G02F 1/133514 345/694 |
| 2012/0187386 | A1* | 7/2012 | Matsumi | H01L 51/5012 257/40 |
| 2012/0242218 | A1* | 9/2012 | Yoshinaga | H01L 27/3213 313/504 |
| 2013/0169705 | A1* | 7/2013 | Kobayashi | G09G 3/3607 345/694 |
| 2013/0249377 | A1* | 9/2013 | Hamer | G09G 3/2003 313/112 |
| 2014/0054555 | A1* | 2/2014 | Kim | H01L 27/322 257/40 |
| 2015/0349033 | A1* | 12/2015 | Shen | H01L 51/5221 257/89 |

FOREIGN PATENT DOCUMENTS

| | | |
|---|---|---|
| JP | 2008-539554 A | 11/2008 |
| JP | 2010-277095 A | 12/2010 |
| JP | 2011-040352 A | 2/2011 |
| JP | 2014-048610 A | 3/2014 |
| JP | 2014-048646 A | 3/2014 |
| JP | 2015-037062 A | 2/2015 |
| JP | 2015-099331 A | 5/2015 |
| WO | 2014/002982 A1 | 1/2014 |

\* cited by examiner

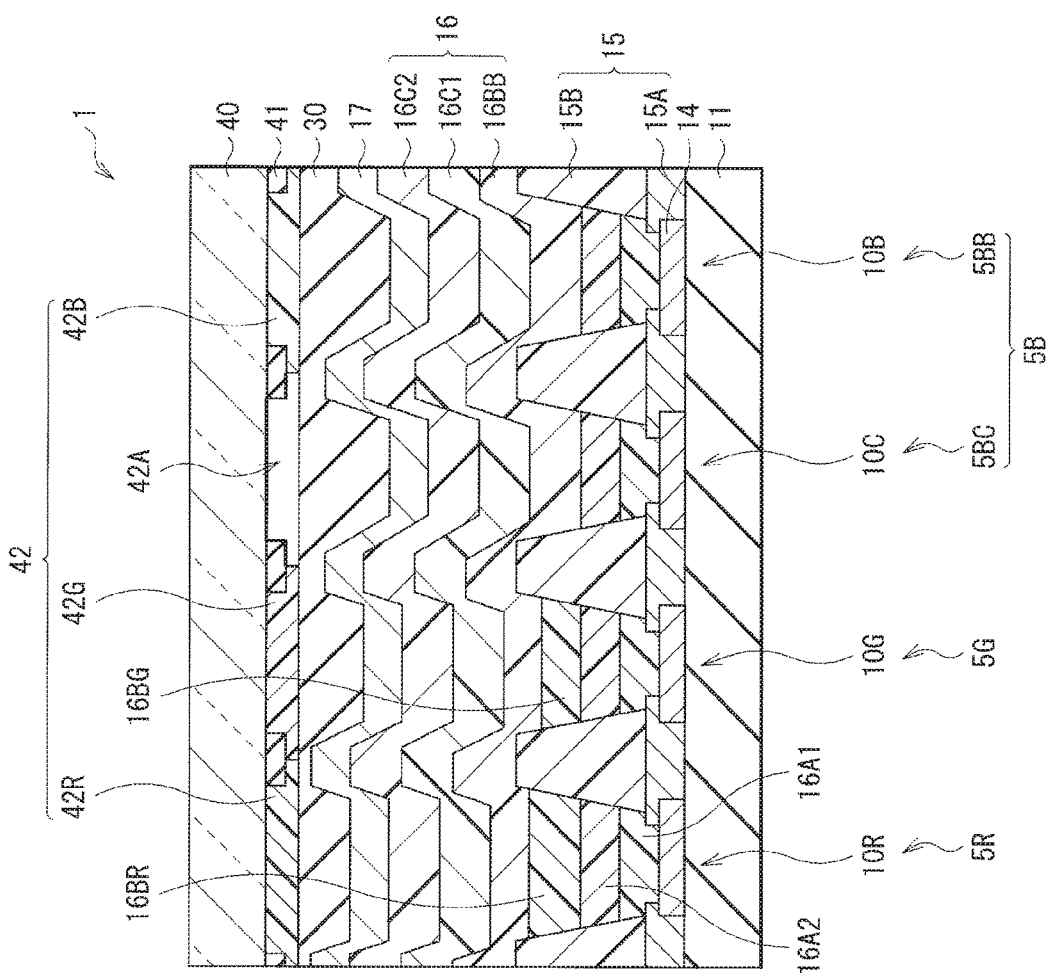

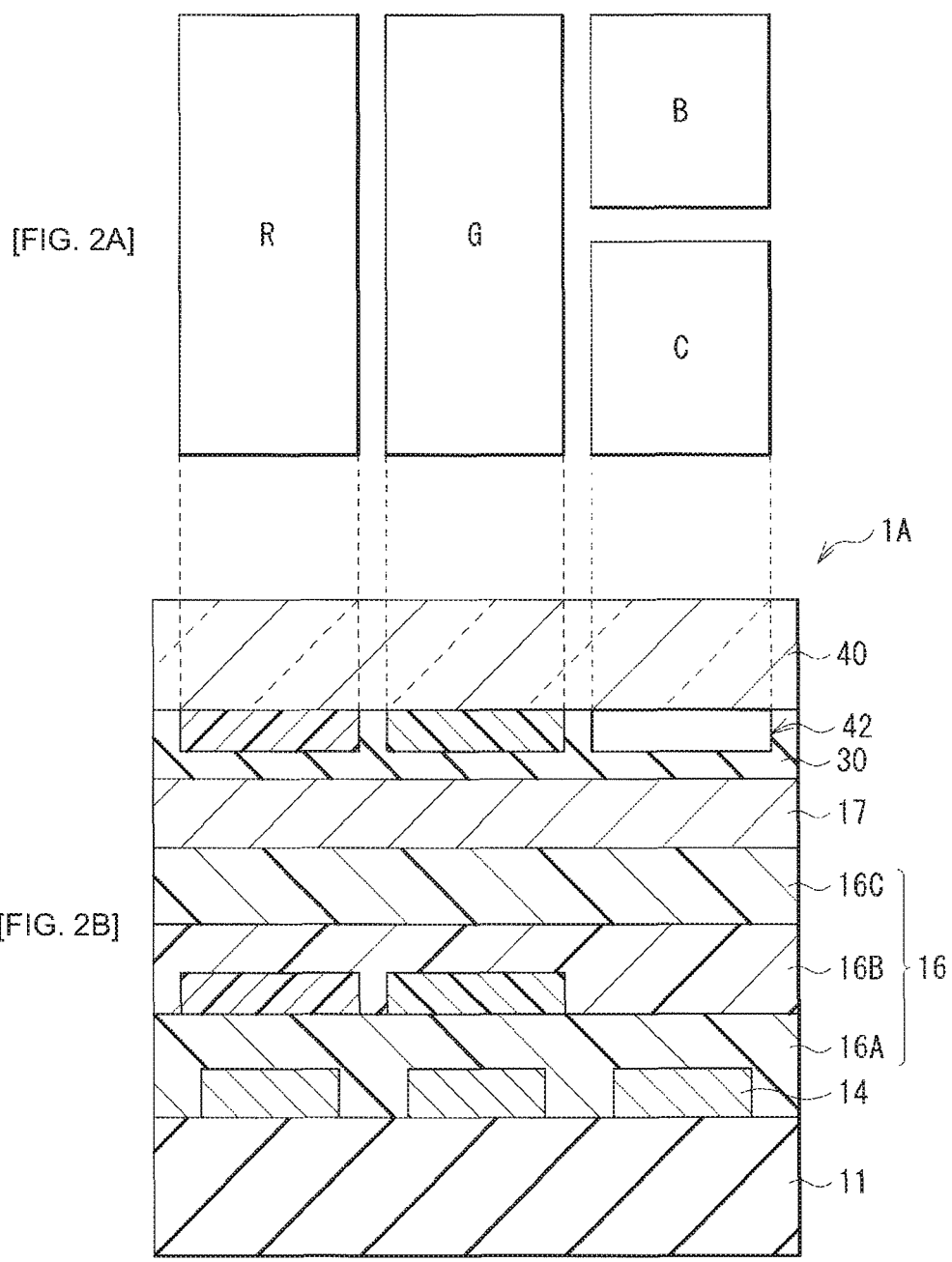

[FIG. 3]
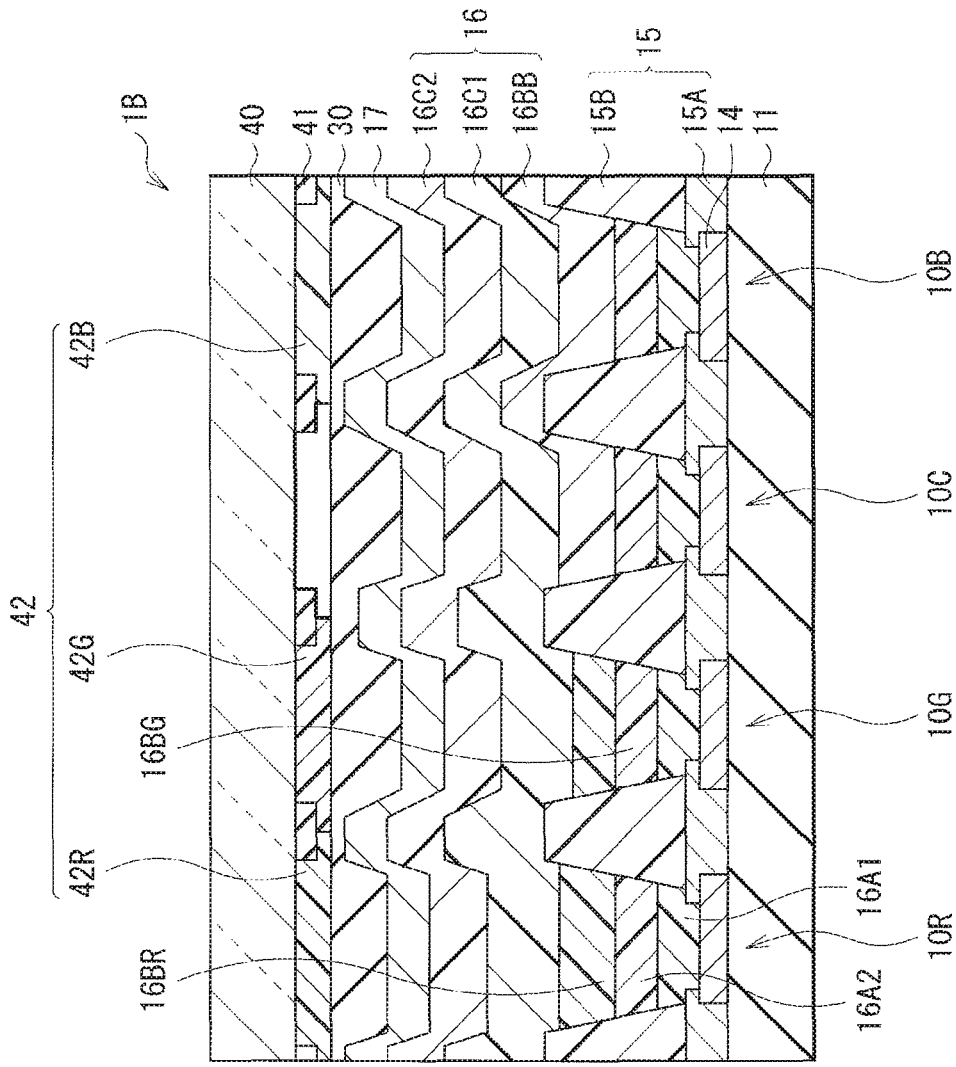

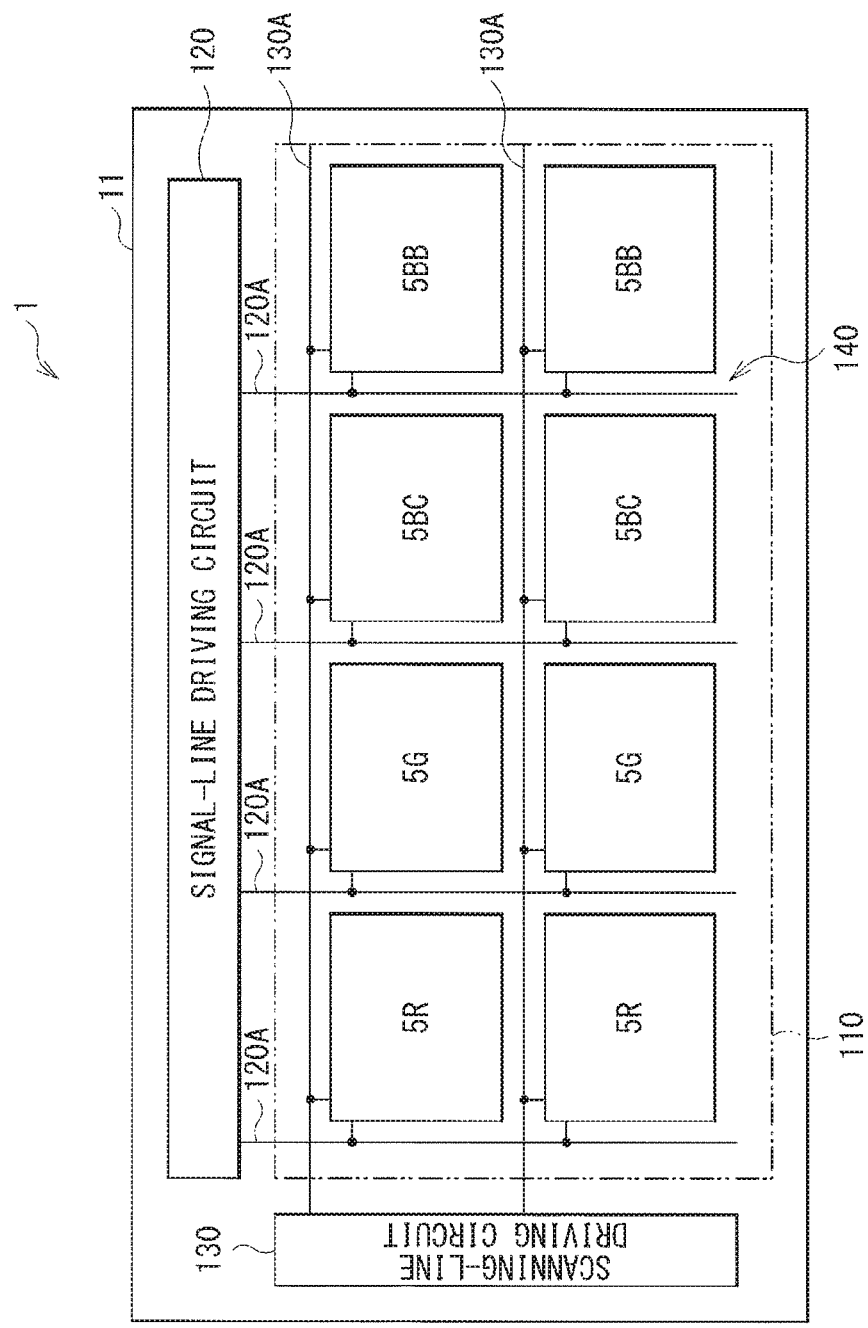
[FIG. 4]

[ FIG. 5 ]
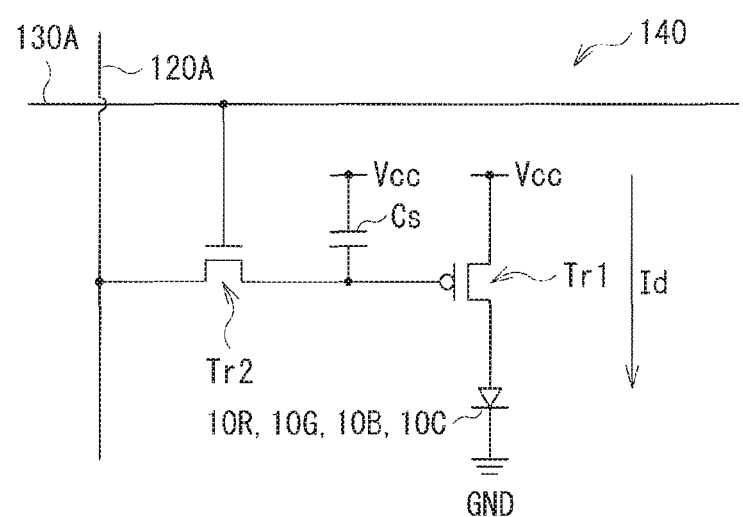

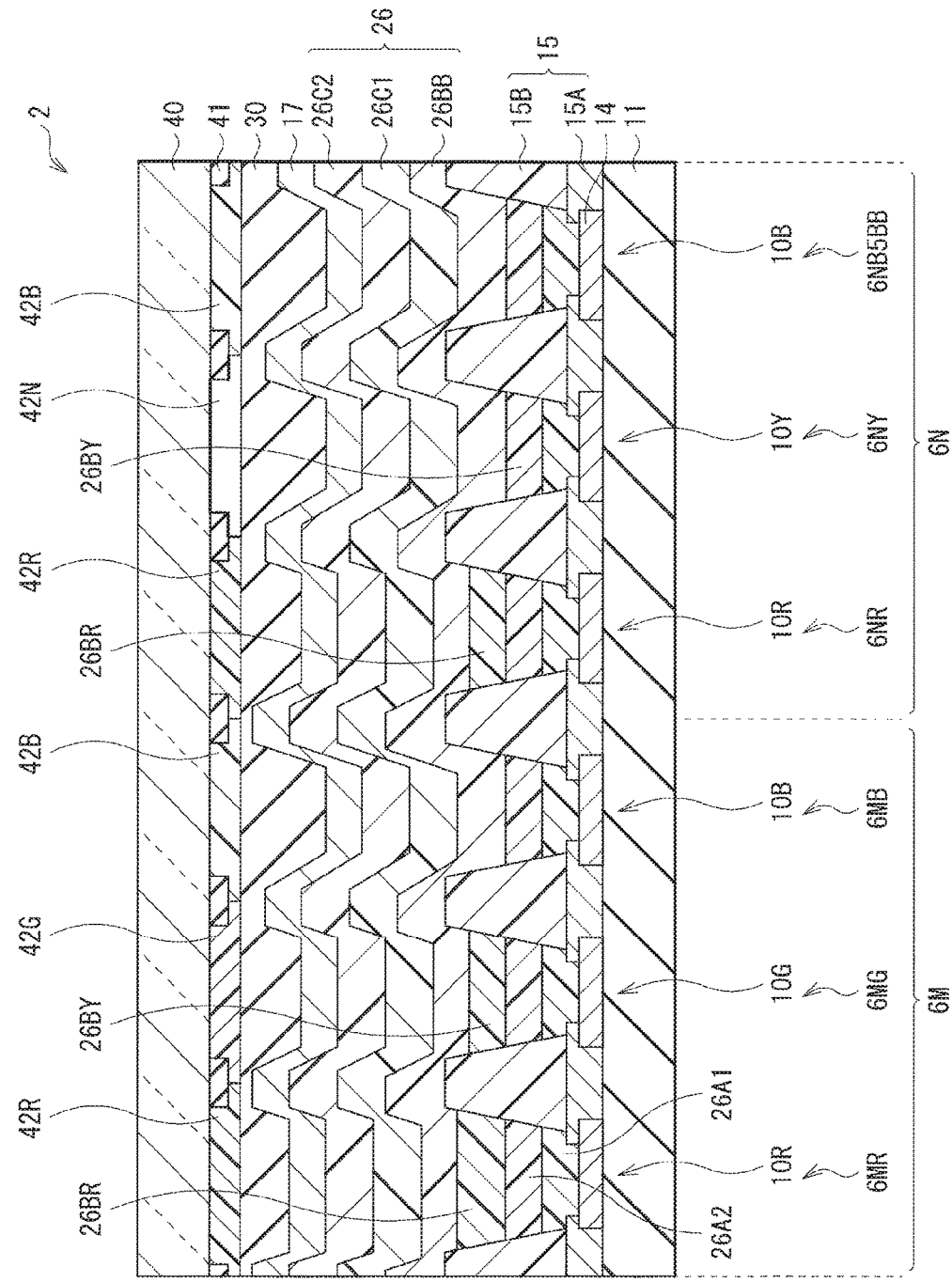
[FIG. 6]

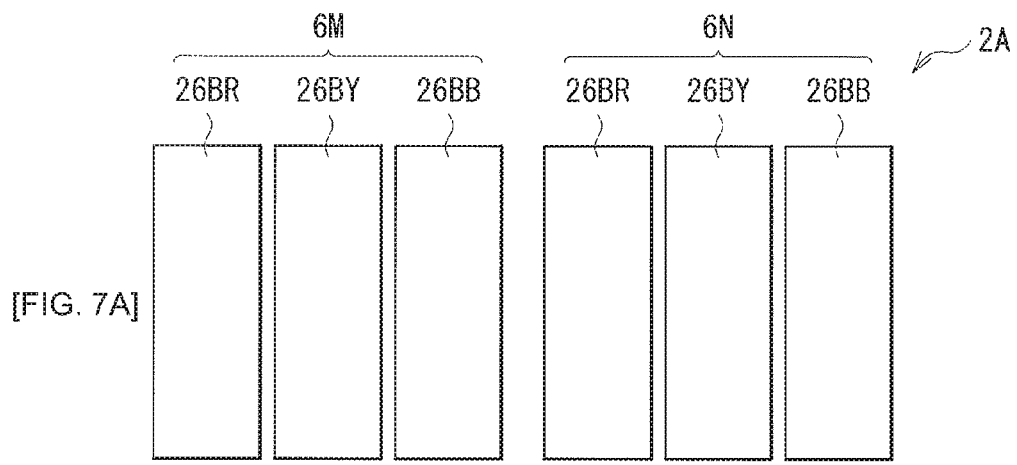
[FIG. 7A]
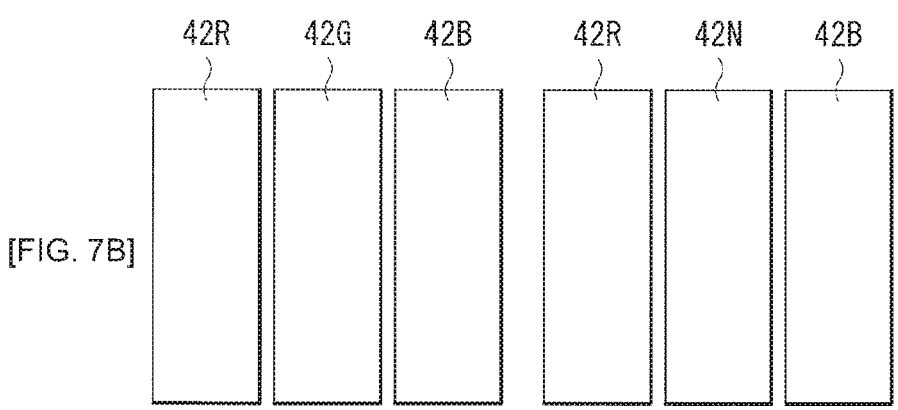
[FIG. 7B]
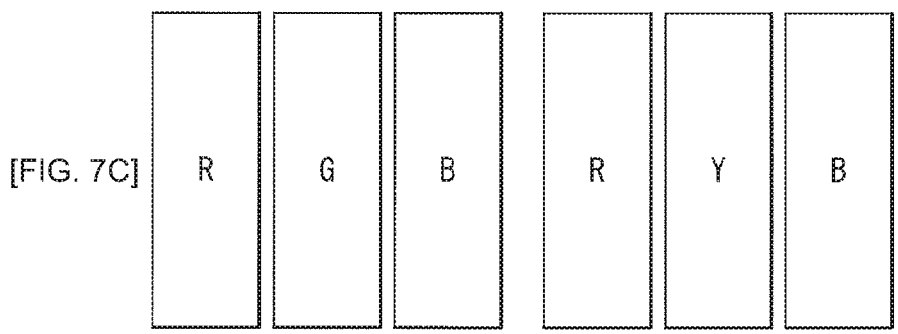
[FIG. 7C]

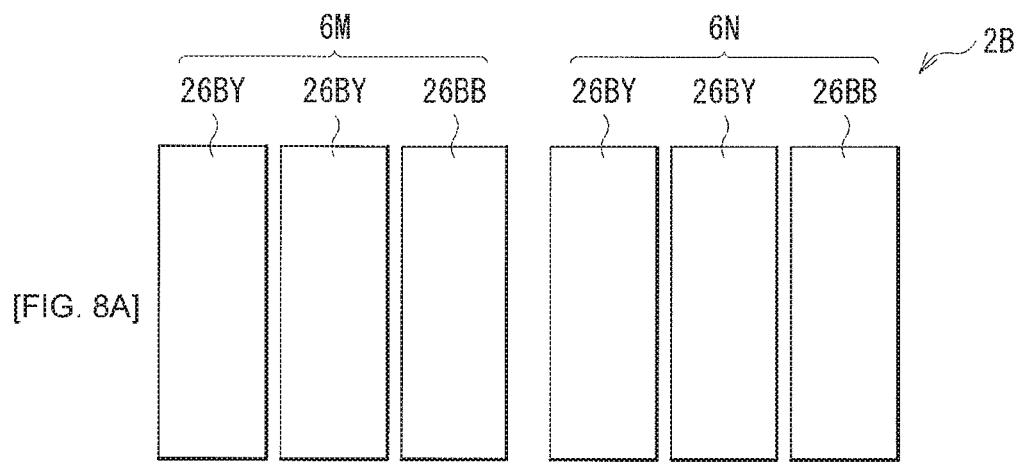
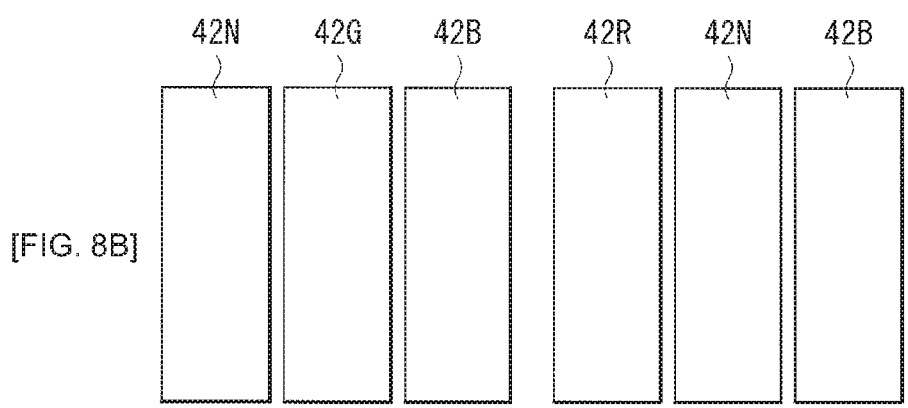
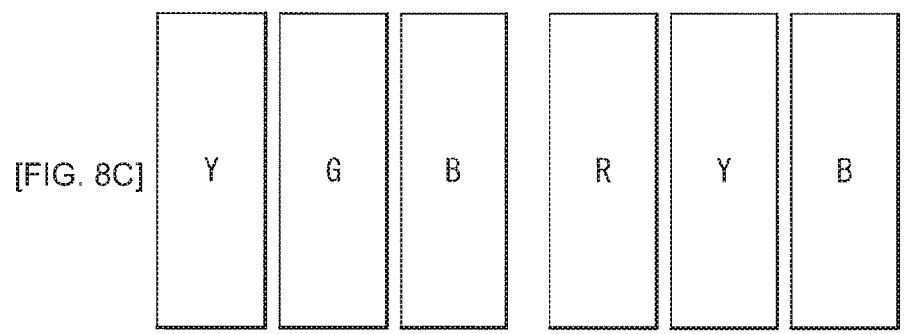

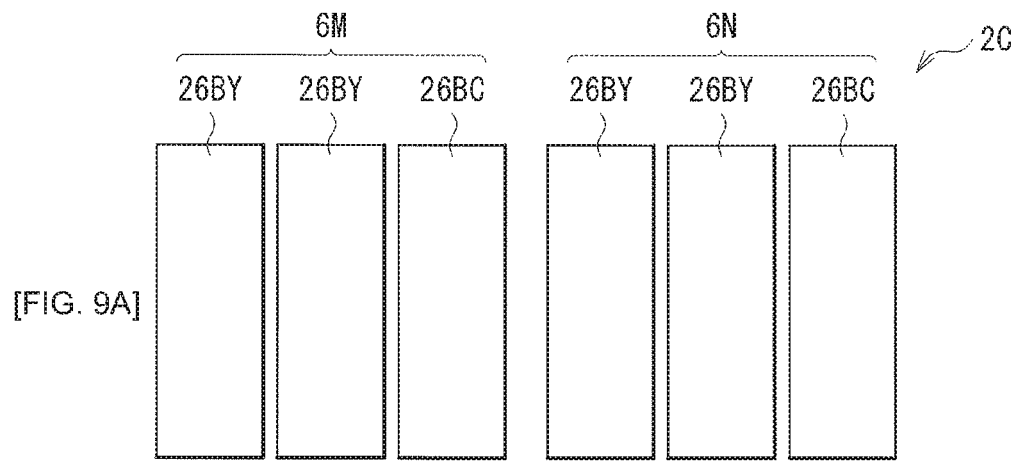
[FIG. 9A]
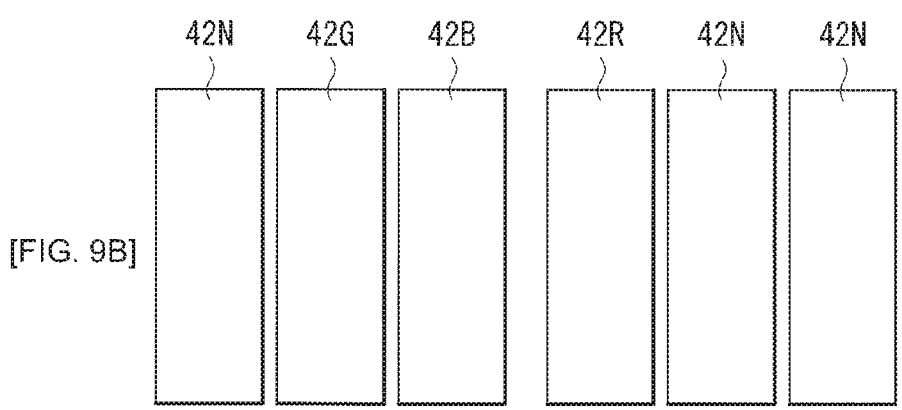
[FIG. 9B]
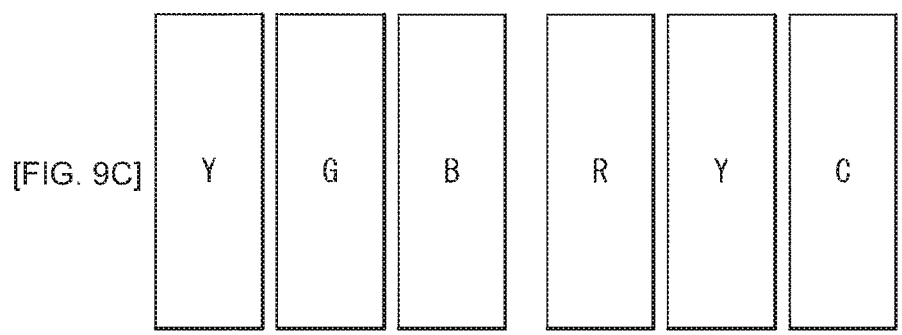
[FIG. 9C]

[ FIG. 10 ]
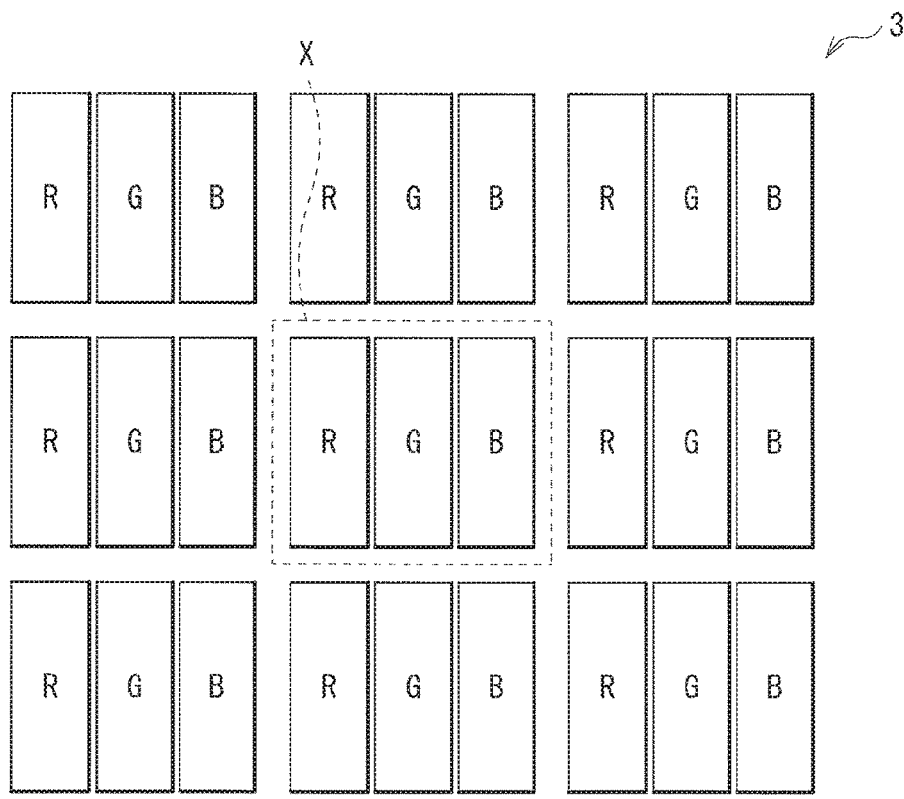
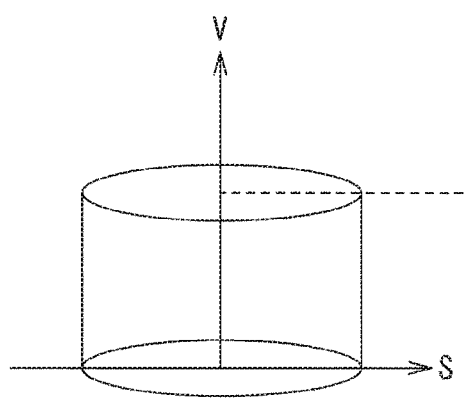
[FIG. 11A]
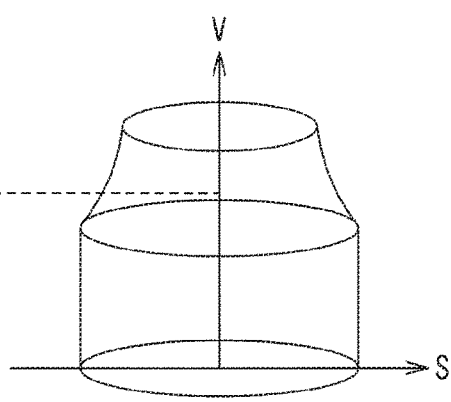
[FIG. 11B]

[ FIG. 12A ]
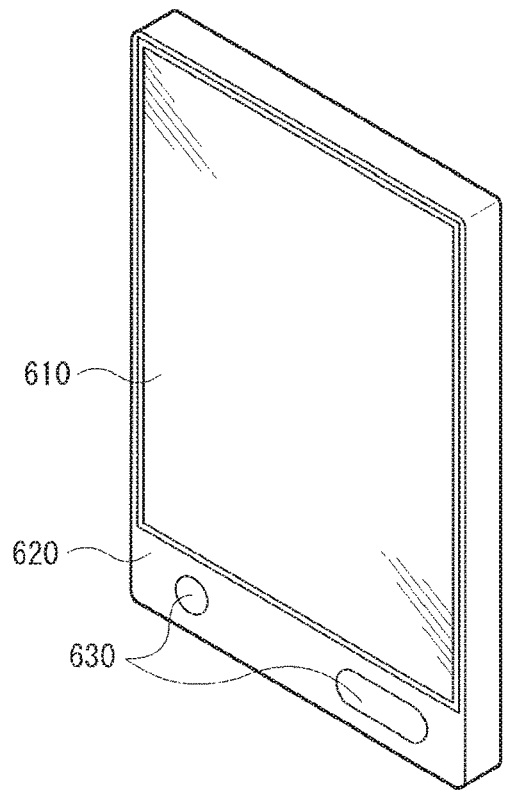
[ FIG. 12B ]
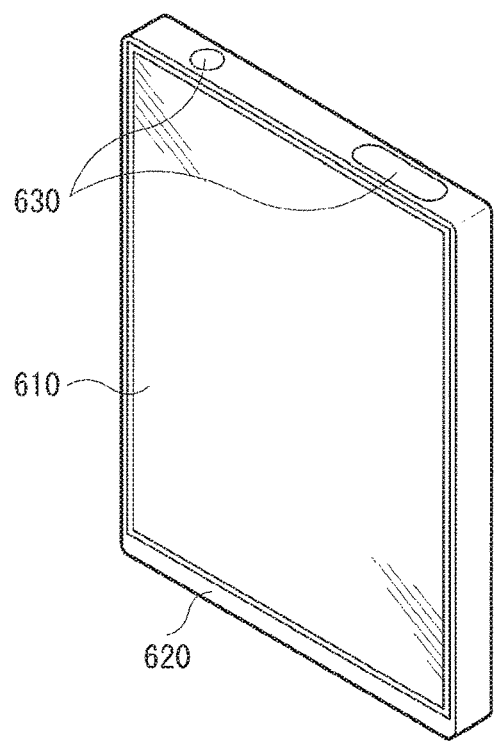

[ FIG. 13 ]
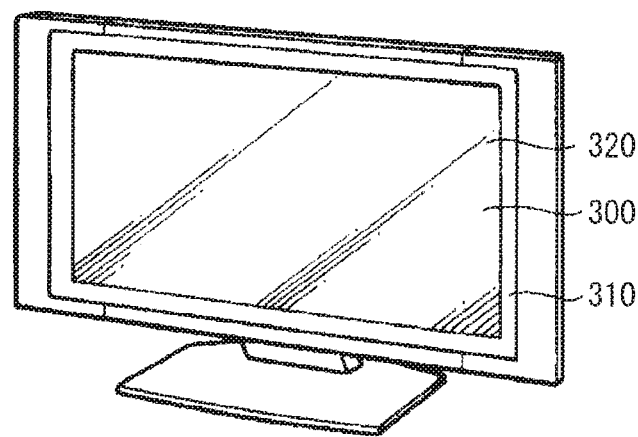
[ FIG. 14A ]
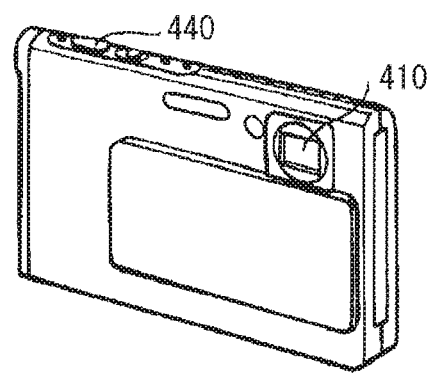
[ FIG. 14B ]
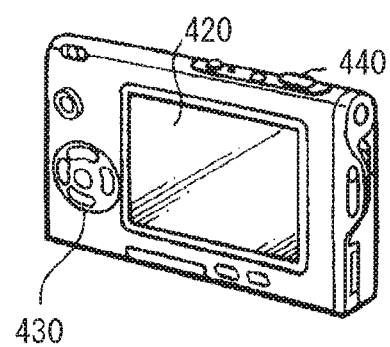

[ FIG. 15 ]
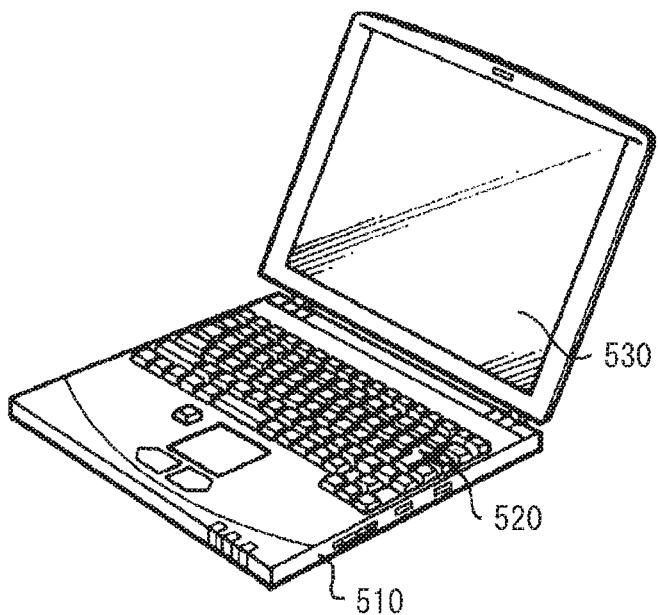
[ FIG. 16 ]
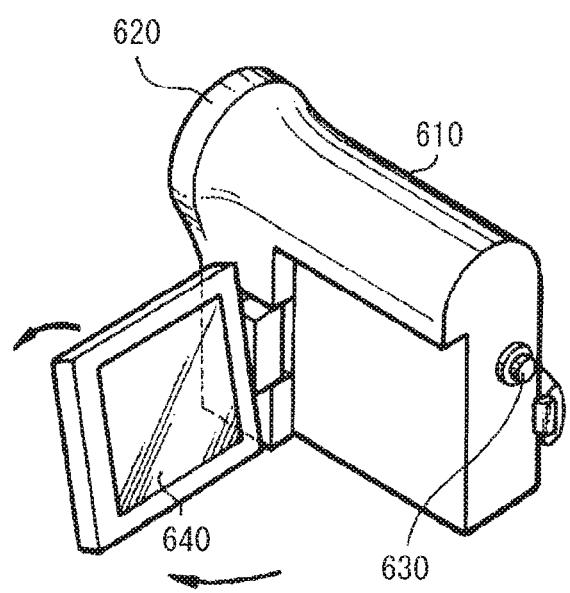

DISPLAY UNIT AND ELECTRONIC APPARATUS

CROSS REFERENCE TO RELATED APPLICATIONS

This application is a U.S. National Phase of International Patent Application No. PCT/JP2015/075959 filed on Sep. 14, 2015, which claims priority benefit of Japanese Patent Application No. JP 2013-203136 filed in the Japan Patent Office on Oct. 1, 2014. Each of the above-referenced applications is hereby incorporated herein by reference in its entirety.

TECHNICAL FIELD

The disclosure relates to a display unit that emits light utilizing an organic electro luminescence (EL) phenomenon, and to an electronic apparatus with the display unit.

BACKGROUND ART

Organic EL devices each emit light utilizing an EL phenomenon of an organic material. The organic EL devices have been receiving attention as a light-emission device with a wide viewing angle, and having not only favorable contrast but also exhibiting a short response time and making it possible to emit high-luminance light. In a display unit (an organic EL display unit), which uses the above-described organic EL devices as light-emission devices emitting color light of red, green, and blue, a color filter of a corresponding color is disposed on the light-emission device of each of the colors. This improves color purity, and makes it possible to deepen a color gamut, as in a display unit discussed in PTL 1, for example.

CITATION LIST

Patent Literature

PTL 1: Japanese Unexamined Patent Application Publication No. 2011-40352

SUMMARY OF THE INVENTION

However, if the color gamut, in particular, a blue color gamut is deepened placing importance on chromaticity of the display unit, light emission efficiency decreases and power consumption further increases, which are disadvantageous.

It is therefore desirable to provide a display unit and an electronic apparatus, which make it possible to perform wide-color-gamut display, while suppressing power consumption.

A first display unit according to one embodiment of the technology includes a first pixel and a second pixel each having a light emitting layer, and a color filter layer disposed to face the first pixel and the second pixel. The color filter layer has a plurality of regions at a position facing at least the first pixel. The plurality of regions vary in optical transmittance.

A second display unit according to one embodiment of the technology includes a first pixel and a second pixel each having a plurality of sub-pixels, and a color filter layer disposed to face the first pixel and the second pixel, and having a plurality of color regions having an arrangement of colors in units of the sub-pixels. At least one of the sub-pixels that correspond to a color arrangement configuration of the color regions that face the first pixel is different, in optical transmittance, from corresponding one of the sub-pixels that correspond to a color arrangement configuration of the color regions that face the second pixel.

A first electronic apparatus according to one embodiment of the technology includes the first display unit described above.

A second electronic apparatus according to one embodiment of the technology includes the second display unit.

In the first display unit according to the embodiment of the technology, the plurality of regions varying in optical transmittance are provided at the position, in the color filter layer, facing at least the first pixel. It is therefore possible to improve efficiency of light extraction from the light emitting layer provided in the first pixel to outside, and to incorporate light of color other than trichromaticity (R, G, and B).

In the second display unit according to the embodiment of the technology, the color filter layer is provided on the first pixel and the second pixel each having the plurality of sub-pixels, and has the plurality of color regions having the arrangement of colors in units of the sub-pixels. Concerning the color filter layer, at least one of the sub-pixels that correspond to a color arrangement configuration of the color regions that face the first pixel is different, in optical transmittance, from corresponding one of the sub-pixels that correspond to a color arrangement configuration of the color regions that face the second pixel. It is therefore possible to improve efficiency of light extraction to outside, and to incorporate light of color other than trichromaticity (R, G, and B).

According to the first display unit of the embodiment and the electronic apparatus of the embodiment of the technology, the plurality of regions varying in optical transmittance are provided at the position, in the color filter layer, facing at least the first pixel. According to the second display unit of the embodiment and the electronic apparatus of the embodiment of the technology, the color filter layer is provided on the first pixel and the second pixel each having the plurality of sub-pixels, and has the plurality of color regions having the arrangement of colors in units of the sub-pixels. Concerning this color filter layer, at least one of the sub-pixels that correspond to the color arrangement configuration of the color regions that face the first pixel is different, in optical transmittance, from corresponding one of the sub-pixels that correspond to the color arrangement configuration of the color regions that face the second pixel. It is therefore possible to improve efficiency of light extraction to outside, and to incorporate light of color other than trichromaticity (R, G, and B). Accordingly, it is possible to provide a display unit having a wide color gamut while suppressing power consumption, and an electronic apparatus with such a display unit. It is to be noted that the effects described above are not necessarily limitative, and any of effects described in the disclosure may be provided.

BRIEF DESCRIPTION OF THE DRAWINGS

FIG. 1 is a cross-sectional view of an example of a configuration of a display unit according to a first embodiment of the disclosure.

FIGS. 2 A and 2B illustrate a plan view and a cross-sectional view of another example of the configuration of the display unit according to the first embodiment of the disclosure.

FIG. 3 is a cross-sectional view of another example of the configuration of the display unit according to the first embodiment of the disclosure.

FIG. 4 is a plan view of an overall configuration of the display unit illustrated in FIG. 1.

FIG. 5 is a diagram illustrating an example of a pixel driving circuit illustrated in FIG. 4.

FIG. 6 is a cross-sectional view of an example of a configuration of a display unit according to a second embodiment of the disclosure.

FIGS. 7A, 7B and 7C are schematic diagrams illustrating an example of a combination of a light emitting layer and a color filter, as well as display color, of the display unit illustrated in FIG. 6.

FIGS. 8A, 8B and 8C are schematic diagrams illustrating another example of the combination of the light emitting layers and the color filters, as well as the display colors, of the display unit according to the second embodiment of the disclosure.

FIGS. 9A, 9B and 9C are schematic diagrams illustrating another example of the combination of the light emitting layers and the color filters, as well as the display colors, of the display unit according to the second embodiment of the disclosure.

FIG. 10 is a plane schematic diagram illustrating a configuration of a pixel of a display unit according to a modification example of the disclosure.

FIGS. 11A and 11B are schematic diagrams illustrating a comparison between (A) luminance per unit area in a comparative example, and (B) luminance per unit area in the display unit illustrated in FIG. 10.

FIG. 12A is a perspective view illustrating an appearance of an example of an application example 1 of a display unit such as the display unit illustrated in FIG. 1.

FIG. 12B is a perspective view illustrating an appearance of another example of the application example 1.

FIG. 13 is a perspective view illustrating an appearance of an application example 2.

FIG. 14A is a perspective view illustrating an appearance of an application example 3 when viewed from front.

FIG. 14B is a perspective view illustrating an appearance of an application example 3 when viewed from back.

FIG. 15 is a perspective view illustrating an appearance of an application example 4.

FIG. 16 is a perspective view illustrating an appearance of an application example 5.

MODES FOR CARRYING OUT THE INVENTION

Some embodiments of the disclosure will be described below in detail in the following order, with reference to the drawings.
1. First Embodiment (an example in which an opening is formed in a part of a color filter corresponding to a blue pixel)
  1-1. Basic Configuration
  1-2. Method of Manufacturing
  1-3. Overall Configuration
2. Second Embodiment (an example in which color filters of respective two pixels next to each other have different color arrangements)
3. Modification Example (an example in which a film thickness of a color filter of part of pixels arranged in a matrix is changed)

1. First Embodiment

FIG. 1 illustrates a cross-sectional configuration of a display unit 1 according to a first embodiment of the disclosure. The display unit 1 may be used as, for example, an organic EL television apparatus, and for example, a display region 110 may be provided on a drive substrate 11. A plurality of pixels 5 each including a red pixel 5R, a green pixel 5G, and a blue pixel 5B as color pixels (sub-pixels; corresponding to a first pixel and a second pixel according to claim 1) are arranged in a matrix within the display region 110, as illustrated in FIG. 4, for example. The color pixels 5R, 5G, and 5B are each provided with a light-emission device 10 corresponding thereto.

[1-1. Basic Configuration]

In the present embodiment, an opening 42A may be provided in a portion (a region) of the color filter of blue (a blue filter 42B) provided on, e.g., the blue pixel 5B, among the color pixels 5R, 5G, and 5B of the pixels 5. The blue pixel 5B may include a region emitting light of blue, and a region emitting light of, for example, cyan. Each of the regions is provided with a pixel electrode 14. The pixel electrodes 14 are independent of one another. The blue pixel 5B has two light-emission devices, which are a blue light-emission device 10B and a cyan light-emission device 10C. The blue pixel 5B therefore substantially has a configuration including two color pixels, which are a blue pixel 5BB and a cyan pixel. The light-emission device 10 may have, for example, a configuration in which an organic layer 16 is disposed between the pixel electrode 14 and a counter electrode 17. For example, a hole supply layer 16A (a hole injection layer 16A1 and a hole transport layer 16A2), a light emitting layer 16B, and an electron supply layer 16C (an electron injection layer 16C2 and an electron transport layer 16C1) may be stacked as the organic layer 16.

It is to be noted that FIG. 1 illustrates an example in which the blue light-emission device 10B and the cyan light-emission device 10C are disposed in parallel within the blue pixel 5B. However, this is not limitative. For example, these light-emission devices may be disposed in a column within the blue pixel 5B, as illustrated in FIGS. 2A and 2B.

The drive substrate 11 is a support member having a main-surface side on which a red light-emission device 10R, a green light-emission device 10G, the blue light-emission device 10B, and the cyan light-emission device 10C are formed in an array. The drive substrate 11 may be an existing substrate. Examples to be used therefor may include films and sheets made of quartz, glass, metallic foil, and resin. Above all, quartz and glass may be preferable, for example. Example materials of the resin may include methacryl resins represented by polymethyl methacrylate (PMMA), polyesters such as polyethylene terephthalate (PET), polyethylene naphthalate (PEN), and polybutylene naphthalate (PBN), and polycarbonate resin. However, it is necessary to provide a laminated structure that suppresses, for example, permeability and gas permeability, and to perform a surface treatment.

The pixel electrode 14 is provided on the drive substrate 11, for each of the red light-emission device 10R, the green light-emission device 10G, the blue light-emission device 10B, and the cyan light-emission device 10C. The pixel electrode 14 may have a thickness in a lamination direction (hereinafter may be simply referred to as thickness) of, for example, 10 nm or more and 1,000 nm or less. The pixel electrode 14 may be made of a simple substance or an alloy of metallic elements such as chromium (Cr), gold (Au), platinum (Pt), nickel (Ni), copper (Cu), tungsten (W), and silver (Ag). Further, the pixel electrode 14 may have a laminated structure including a metal film and a transparent conductive film. The metal film may be made of a simple substance or an alloy of the above-mentioned metallic elements. The transparent conductive film may be made of, for example, indium tin oxide (ITO), indium zinc oxide (InZnO), and an alloy of zinc oxide (ZnO) and aluminum (Al). It is to be noted that, when the pixel electrode 14 is used as an anode, the pixel electrode 14 may be preferably made of a material having high hole-injection ability. However, a material, such as an Al alloy, having an issue of a hole-injection barrier due to existence of a surface oxide film or a small work function, is allowed to be used as the pixel electrode 14, by providing the hole injection layer 16A1 of an appropriate type.

A partition 15 is provided to secure an insulation property between the pixel electrode 14 and the counter electrode 17, and to give a desired shape to a light emission region. Furthermore, the partition 15 also has a function of serving as a partition when coating is performed using an inkjet method or a nozzle coating method in a manufacturing process to be described later. The partition 15 may have, for example, an upper partition 15B, and a lower partition 15A provided below the upper partition 15B. The lower partition 15A may be made of an inorganic insulating material such as $SiO_2$. The upper partition 15B may be made of a photosensitive resin such as positive-type photosensitive polybenzoxazole and positive-type photosensitive polyimide. The partition 15 has an opening corresponding to the light emission region. It is to be noted that the organic layer 16 and the counter electrode 17 may be provided not only on the opening but also on the partition 15, but light emission occurs only in the opening of the partition 15.

The light-emission device 10 may have, for example, a configuration in which the hole supply layer 16A (the hole injection layer 16A1 and the hole transport layer 16A2), the light emitting layer 16B, and the electron supply layer 16C (the electron injection layer 16C2 and the electron transport layer 16C1) are stacked in this order from the pixel electrode 14 side, between the pixel electrode 14 and the counter electrode 17, as described above. Here, the red light-emission device 10R and the green light-emission device 10G are provided with corresponding light emitting layers (the red light emitting layer 16BR and the green light emitting layer 18BG). The blue light-emission device 10B and the cyan light-emission device 10C are provided with a common light emitting layer (the blue light emitting layer 16BB). The blue light emitting layer 16BB is extended further onto the red light-emission device 10R and the green light-emission device 10G as well. For this reason, the blue light emitting layer 16BB is stacked on the red light emitting layer 16BR and the green light emitting layer 18BG, in the red light-emission device 10R and the green light-emission device 10G, respectively.

The hole injection layer 16A1 is a buffer layer provided to increase efficiency of hole injection to each of light emitting layers 16CR, 16CG, and 16CB, and to prevent leakage. The hole injection layer 16A1 is provided on the pixel electrode 14, for each of the red light-emission device 10R, the green light-emission device 10G, and the blue light-emission device 10B.

The hole injection layer 16A1 may have, for example, a thickness of preferably 5 nm to 100 nm, and more preferably 8 nm to 50 nm. A material of the hole injection layer 16A1 may be selected as appropriate considering a relationship with a material of an electrode or a material of an adjacent layer. Examples of the material of the hole injection layer 16A1 may include polyaniline, polythiophene, polypyrrole, polyphenylene vinylene, polythienylene vinylene, polyquinoline, polyquinoxaline, and their derivatives; electrically-conductive polymers such as a polymer including an aromatic amine structure in a main chain or a side chain; metallophthalocyanine (such as copper phthalocyanine); and carbon.

When the material used for the hole injection layer 16A1 is a polymer material, a weight-average molecular weight (Mw) of this polymer material may be in a range of 5,000 to 300,000, and in particular, may be preferably about 10,000 to about 200,000. Alternatively, an oligomer of about 2,000 to about 10,000 may be used. In this case, however, if Mw is less than 5,000, the hole injection layer may dissolve when the hole transport layer and subsequent layers are formed. In addition, if Mw exceeds 300,000, the material may gel, making it difficult to form a film.

Examples of a typical electrically-conductive polymer used as the material of the hole injection layer 16A1 may include polyaniline, oligoaniline, and polydioxythiophene such as poly(3,4-ethylenedioxythiophene) (PEDOT). Other examples may include a polymer commercially available under the name "Nafion" (trademark) from H. C. Starck GmbH, a polymer commercially available in a dissolved form under the product name "Liquion" (trademark), "EL source" (trademark) available from Nissan Chemical Industries, Ltd., and a conductive polymer available under the name "Verazol" (trademark) from Soken Chemical & Engineering, Co., Ltd.

The hole transport layer 16A2 is provided to increase efficiency of hole transport to the light emitting layer 16B. The hole transport layer 16A2 is provided on the hole injection layer 16A1, for each of the red light-emission device 10R, the green light-emission device 10G, and the blue light-emission device 10B.

The hole transport layer 16A2 may have, for example, a thickness of preferably 10 nm to 200 nm, and more preferably 15 nm to 150 nm, depending on the overall configuration of the device. As a polymer material of the hole transport layer 16A2, a light emission material soluble in an organic solvent may be used. Examples of this light emission material may include polyvinylcarbazole, polyfluorene, polyaniline, polysilane as well as their derivatives, polysiloxane derivatives having an aromatic amine in a main chain or a side chain, polythiophene as well as derivatives thereof, and polypyrrole.

It is to be noted that, in the present embodiment, the hole injection layer 16A1, the hole transport layer 16A2, the red light emitting layer 16BR, and the green light emitting layer 16BG are formed using a coating method. For this reason, it is necessary to use, for the hole injection layer 16A1 and the hole transport layer 16A2, a compound that cross-links owing to a process such as a heat treatment and becomes insoluble in a solvent after these layers are formed.

Light emission occurs in the red light emitting layer 16BR, the green light emitting layer 16BG, and the blue light emitting layer 16BB, when electron-hole recombination is effected by application of an electric field. The red light emitting layer 16BR and the green light emitting layer 16BG may each have, for example, a thickness of preferably 10 nm to 200 nm, and more preferably 15 nm to 150 nm, depending on the overall configuration of the device. The blue light emitting layer 16BB common to the light-emission devices 10R, 10G, 10B, and 10C may have, for example, a thickness of preferably 10 nm to 200 nm, and more preferably 15 nm to 150 nm, depending on the overall configuration of the device.

Examples of a material of each of the red light emitting layer 16BR and the green light emitting layer 16BG may include phosphor light-emission materials, in addition to fluorescent light-emission materials generally used. It may be preferable to use the phosphor light-emission materials. The fluorescent light-emission materials directly return from an excited state, i.e., a singlet state to a ground state, and emit light at this moment. The singlet state is a state in which energy is high and unstable, and therefore has a short life. In contrast, the phosphor light-emission materials return from a singlet state to a slightly stable intermediate state, namely, a triplet state, and then to a ground state. This is because the triplet state is a state resulting from a transition from the singlet state, and thus fluorescence has a longer life as compared with phosphorescence. Further, among the phosphor light-emission materials, it may be preferable to use a low-molecular material. Here, the low-molecular material is a material other than compounds made of molecules of high-molecular-weight polymer or condensation product that is produced as a result of repetition of the same chain-reaction or a similar chain-reaction by a low-molecular compound, i.e. a material whose molecular weight is substantially the same. In addition, a new chemical bond between molecules by heating does not occur, and the material exists in the form of single molecule. Preferably, such a low-molecular material may have a weight-average molecular weight (Mw) of 10,000 or less.

When a phosphor light-emission material is used as a host material to be doped with a dopant, examples of the dopant may include a phosphor metal-complex compound. Specifically, an orthometalated metal complex or a porphyrin metal complex may be used. As a central metal, it may be preferable to use a metal selected from groups 7 to 11 in a periodic table. Examples of this metal may include ruthenium (Ru), rhodium (Rh), palladium (Pd), silver (Ag), rhenium (Re), osmium (Os), iridium (Ir), platinum (Pt), and gold (Au). It is to be noted that one kind or two or more kinds may be used for the above-described dopant. Further, dopants having different central metal may be combined.

Examples of a material of the blue light emitting layer 16BB may include an anthracene compound. This anthracene compound is used as a host material doped with a guest material of a blue or green fluorescent pigment, and thereby blue or green light emission occurs in the blue light emitting layer 16BB.

In contrast, examples to be used for the light emission guest material of the blue light emitting layer 16BB may include a low-molecular fluorescent material having high light emission efficiency, and an organic light emission material such as a phosphorescent dye and a metal complex.

Here, the light emission guest material for blue may be a compound whose wavelength range of light emission has a peak in a range of about 400 nm to about 500 nm. As such a compound, an organic substance such as a naphthalene derivative, an anthracene derivative, a naphthacene derivative, a styrylamine derivative, and a bis(azinyl)methane boron complex may be used. Above all, preferably, the compound may be selected from an aminonaphthalene derivative, an aminoanthracene derivative, an aminochrysene derivative, an aminopyrene derivative, a styrylamine derivative, and a bis(azinyl)methane boron complex. It is to be noted that the material used for the blue light emitting layer 16BB is not limited to the above-described fluorescent materials, and phosphorescence may be used.

It is to be noted that the blue light emitting layer 16BB is not necessarily a layer common to the light-emission devices 10R, 10G, 10B, and 10C. For example, as illustrated in FIG. 3, there may be provided a configuration in which the blue light emitting layer 16BB is formed only on the blue light-emission device 10B and the cyan light-emission device 10C, without being provided on the red light-emission device 10R and the green light-emission device 10G. In addition, when each of the light emitting layers 16BR, BG, and BB are formed using a phosphor light-emission material, it may be preferable to provide a coupling layer (not illustrated) between the red light emitting layer 16BR and the blue light emitting layer 16BB, and between the green light emitting layer 16BG and the blue light emitting layer 16BB. The coupling layer is provided to confine a triplet exciton formed in the red light emitting layer 16BR and the green light emitting layer 16BG, into the red light emitting layer 16BR and the green light emitting layer 16BG. The coupling layer is provided also to improve efficiency of hole injection to the blue light emitting layer 16BB.

Preferably, the coupling layer may be made of a material in which excited triplet energy is sufficiently larger than excited triplet energy of the red light emitting layer 16BR and the green light emitting layer 16BG. In addition, it may be preferable to adopt a material having high hole transport ability to improve the efficiency of hole injection to the blue light emitting layer 16BB, and not causing a large hole-injection barrier against the hole transport layer 16A1 for the blue organic EL device. Furthermore, it may be preferable to adopt a low-molecular material that allows for formation with vapor deposition. Specific examples may include benzine, styrylamine, triphenylamine, porphyrin, triphenylene, azatriphenylene, tetracyanoquinodimethane, triazole, imidazole, oxadiazole, polyarylalkane, phenylenediamine, arylamine, oxazole, anthracene, fluorenone, hydrazone, stilbene, and their derivatives, and a monomer or an oligomer in a conjugated heterocyclic system such as a vinylcarbazole-based compound, a thiophene-based compound, and an aniline-based compound.

The coupling layer may have, for example, a thickness of preferably 1 nm to 30 nm, and more preferably 1 nm to 15 nm, depending on the overall configuration of the device.

The electron transport layer 16C1 is provided to increase efficiency of electron transport to the red light emitting layer 16BR, the green light emitting layer 16BG, and the blue light emitting layer 16BB. The electron transport layer 16C1 is provided on the blue light emitting layer 16BB, as a layer common to the light-emission devices 10R, 10G, 10B, and 10C. The electron transport layer 16C1 may have, for example, a thickness of preferably 5 nm to 300 nm, and more preferably 10 nm to 170 nm, depending on the overall configuration of the device.

For a material of the electron transport layer 16C1, it may be preferable to use an organic material having favorable electron transport ability. Increasing the efficiency of the electron transport to the light emitting layer, in particular, the red light emitting layer 16BR and the green light emitting layer 16BG, suppresses changes in light-emission color due to field intensity in the red light-emission device 10R and the green light-emission device 10G, As such an organic material, specifically, a nitrogen-containing heterocycle derivative with electron mobility of $10^{-6}$ $cm^2/Vs$ or more and $1.0 \times 10^{-1}$ $cm^2/Vs$ or less may be used.

It is to be noted that the organic material to be used for the electron transport layer 16C1 may be preferably a compound having an anthracene skeleton, but is not limited thereto. For example, a material such as a benzimidazole derivative, a pyridylphenyl derivative, or a bipyridyl derivative that each have a pyrene skeleton or chrysene skeleton in place of the anthracene skeleton may be used. Further, for the electron transport layer 16C1, one kind of organic material may be used, or two or more kinds of mixed or laminated organic materials may be used. Furthermore, these organic materials may also be used for the electron injection layer 16C2 to be described later.

The electron injection layer 16C2 is provided to increase electron injection efficiency, and provided on the electron transport layer 16C1 as a common layer similarly to the electron transport layer 16C1. Examples of a material of the electron injection layer 16C2 may include lithium oxide ($LiO_2$) which is an oxide of lithium (Li), cesium carbonate ($Cs_2CO_3$) which is a complex oxide of cesium (Cs), and a mixture of these oxide and complex oxide. Further, the electron injection layer 16C2 is not limited to such materials. For example, alkaline earth metal such as calcium (Ca) and barium (Ba), alkali metal such as lithium and cesium, and metal having small work function such as indium (In) and magnesium (Mg) may be used. Further, for example, oxides, complex oxides, and fluoride of these kinds of metal may be used as a simple substance. Furthermore, a mixture or an alloy of these metal, oxides, complex oxides, and fluoride may be increased in stability and used.

The counter electrode 17 may have, for example, a thickness of 2 nm or more and 150 nm or less, and may be made of a metal conductive film. Specific examples may include an alloy using Al, Mg, Ca, or Na. In particular, an alloy of magnesium and silver (a Mg—Ag alloy) may be preferable because this alloy has both conductivity and low absorption characteristics when provided as a thin film. A ratio between magnesium and silver in the Mg—Ag alloy is not limited in particular. However, a film thickness ratio may be preferably in a range of Mg:Ag=20:1 to 1:1. In addition, the material of the counter electrode 17 may be an alloy of Al and Li (an Al—Li alloy).

Furthermore, the counter electrode 17 may be a mixed layer containing organic light emission materials such as a quinoline aluminum complex, a styrylamine derivative, and a phthalocyanine derivative. In this case, a layer having a light transmitting property such as MgAg may be separately provided as a third layer. It is to be noted that, in a case of an active matrix drive system, the counter electrode 17 is formed as a continuous film on the drive substrate 11, in a state of being insulated from the pixel electrode 14 by the organic layer 16 and the partition 15. The counter electrode 17 is used as an electrode common to the red light-emission device 10R, the green light-emission device 10G, the blue light-emission device 10B, and the cyan light-emission device 10C.

A protective layer 30 may have, for example, a thickness of 2 μm to 3 μm, and may be made of either an insulating material or a conductive material. The insulating material may be preferably an inorganic amorphous insulating material. Examples of the inorganic amorphous insulating material may include amorphous silicon (α-Si), amorphous silicon carbide (α-SiC), amorphous silicon nitride ($\alpha\text{-}Si_{1-x}N_x$), and amorphous carbon (α-C). The inorganic amorphous insulating material forms no grain, and thus serves as a favorable protective film with low permeability.

A counter substrate 40 is located on a side where the counter electrode 17 of the red light-emission device 10R, the green light-emission device 10G, the blue light-emission device 10B, and the cyan light-emission device 10C is provided. The counter substrate 40 is provided to seal each of the light-emission devices 10R, 10G, 10B, and 10C with a bonding layer (not illustrated). The counter substrate 40 is made of a material such as a glass transparent with respect to light generated in each of the light-emission devices 10R, 10G, 10B, and 10C. The counter substrate 40 may be provided with, for example, a black matrix 41 and a color filter layer 42. The counter substrate 40 may extract light generated in each of the light-emission devices 10R, 10G, 10B, and 10C, and absorb outside light reflected by each of the light-emission devices 10R, 10G, 10B, and 10C as well as wiring between these devices, in order to improve contrast. It is to be noted that the configuration, in which the counter electrode 17 is a reflecting electrode and light generated from the transparent pixel electrode 14 is extracted, is not limited to the above-described example. For example, an opaque material may be used for the protective layer 30 and the counter substrate 40. In this case, it is possible to obtain an effect similar to the above-described effect, by forming the black matrix 41 and the color filter layer 42 on a pixel driving circuit 140 on the pixel electrode 14 side.

The black matrix 41 may be made of, for example, a black resin film mixed with a black coloring agent and having optical density of 1 or more, or a thin-film filter utilizing thin-film interference. Using the black resin film of these makes it possible to form an inexpensive black matrix easily, and thus may be preferable. The thin-film filter may be formed, for example, by stacking one or more layers of thin films made of metal, metal nitride, or metal oxide. The thin-film filter is provided to attenuate light by utilizing the thin-film interference. Specific examples of the thin-film filter may include a filter in which Cr and chromium oxide (III) ($Cr_2O_3$) are alternately stacked.

In the color filter layer 42, a red filter 42R, a green filter 42G, and the blue filter 42B are formed at respective positions corresponding to the red light-emission device 10R, the green light-emission device 10G, and the blue light-emission device 10B. The opening 42A may be formed at, for example, a position corresponding to the cyan light-emission device 10C. For example, the color filters 42R, 42G, and 42B may each have a rectangular shape, and may be formed with no clearance therebetween. The color filters 42R, 42G, and 42B are each made of resin mixed with a pigment. The color filters 42R, 42G, and 42B are each adjusted by selecting a pigment to have a high optical transmittance in an intended wavelength region of red, green, or blue and to have a low optical transmittance in other wavelength regions. It is to be noted that, here, the opening 42A is provided at the position corresponding to the cyan light-emission device 10C of the color filter layer 42, but this is not a limiting configuration. For example, a transparent resin layer formed of a transparent resin material having a light transmitting property may be provided.

[1-2. Method of Manufacturing]

The display unit 1 may be manufactured, for example, as follows.

First, on the drive substrate 11 made of the material described above, the pixel driving circuit 140 including a drive transistor Tr1 is formed. For example, a planarizing insulating film (not illustrated) made of photosensitive resin may be formed.

[Process of Forming Pixel Electrode 14]

Next, a transparent conductive film made of, for example, ITO may be formed on the entire surface of the drive substrate 11. This transparent conductive film is patterned to form the pixel electrode 14 for each of the red light-emission device 10R, the green light-emission device 10G, the blue light-emission device 10B, and the cyan light-emission device 10C. In this formation, the pixel electrode 14 is brought into conduction with a drain electrode of the drive transistor Tr1 (see FIG. 5) through a contact hole (not illustrated) of the planarizing insulating film (not illustrated).

(Process of Forming Partition 15)

Subsequently, a film of an inorganic insulating material such as $SiO_2$ may be formed on the pixel electrode 14 and the planarizing insulating film (not illustrated) by, for example, chemical vapor deposition (CVD). This film of the inorganic insulating material is patterned using a photolithography technique and an etching technique, to form the lower partition 15A.

Afterward, the upper partition 15B made of the photosensitive resin described above is formed at a predetermined position with respect to the lower partition 15A, specifically, at a position surrounding the light emission region of the pixel. The partition 15 configured of the upper partition 15B and the lower partition 15A is thereby formed.

After the partition 15 is formed, a surface on side, on which the pixel electrode 14 and the partition 15 are formed, of the drive substrate 11 is subjected to an oxygen plasma treatment. This removes contaminants such as organic matters attached to the surface, thereby improving wettability. Specifically, the drive substrate 11 may be heated to a predetermined temperature, e.g., about 70° C. to about 80° C., and then, the plasma treatment in which oxygen is used as reactant gas under atmospheric pressure (i.e. an $O_2$ plasma treatment) is performed.

[Process of Performing Water Repellent Treatment]

Following the plasma treatment, a water repellent treatment (a liquid-repellent treatment) is performed to decrease, in particular, wettability on a top surface and a side surface of the upper partition 15B. Specifically, this may be performed as follows. A plasma treatment (a $CF_4$ plasma treatment) in which tetrafluoromethane is used as reactant gas under atmospheric pressure is performed. Subsequently, the top surface and the side surface of the upper partition 15B are caused to be liquid repellent by cooling the drive substrate 11, which has been heated for the plasma treatment, to ambient temperature, so that the wettability thereof is decreased.

It is to be noted that, in this $CF_4$ plasma treatment, an exposed surface of the pixel electrode 14 and the lower partition 15A may also be affected to some extent. However, in this treatment, materials such as ITO that is the material of the pixel electrode 14 and $SiO_2$ that is the material of the lower partition 15A have a low affinity to fluorine, and therefore the wettability of the surface having the wettability improved by the oxygen plasma treatment is maintained as it is.

[Process of Forming Hole Injection Layer 16A1]

After the water repellent treatment is performed, the hole injection layer 16A1 made of the material described above is formed in a region surrounded by the upper partition 15B. The hole injection layer 16A1 is formed by a coating method such as a spin coating method and a droplet discharge method. In particular, when the material of the hole injection layer 16A1 is selectively arranged in the region surrounded by the upper partition 15B, it may be preferable to use an inkjet method that is a droplet discharge method, or a nozzle coating method. It is to be noted that, when the hole injection layer 16A1 is formed to have a uniform film thickness, it is possible to reduce the number of processes by applying the material in one step in the region by using a method such as a slit coating method.

Specifically, a solution or a dispersion liquid of the material of the hole injection layer 16A1 such as polyaniline and polythiophene may be arranged on the exposed surface of the pixel electrode 14 by, for example, an inkjet method. Afterward, the hole injection layer 16A1 is formed by performing a heat treatment (a dry treatment).

In the heat treatment, the solvent or the dispersion liquid is heated at a high temperature after being dried. When an electrically-conductive polymer such as polyaniline and polythiophene is used, it may be preferable to perform the heat treatment in an air atmosphere or an oxygen atmosphere. This is because conductivity is easily exhibited owing to oxidation of the electrically-conductive polymer by oxygen.

A heating temperature may be preferably 150° C. to 300° C., and more preferably 180° C. to 250° C. A duration may be preferably about 5 minutes to about 30 minutes, and more preferably 10 minutes to 240 minutes, depending on the temperature and atmospheric condition. A film thickness after this drying may be preferably 5 nm to 100 nm, and more preferably 8 nm to 50 nm.

[Process of Forming Hole Transport Layer 16A2]

After the hole injection layer 16A1 is formed, the hole transport layer 16A2 including the polymer material described above is formed on the hole injection layer 16A1, for each of the red light-emission device 10R, the green light-emission device 10G, and the blue light-emission device 10B. The hole transport layer 16A2 is formed by coating such as a spin coating method and a droplet discharge method. In particular, it may be preferable to use an inkjet method that is a droplet discharge method, or a nozzle coating method, since it is necessary to arrange the material of the hole transport layer 16A2 selectively in a region surrounded by the upper partition 15B.

Specifically, a mixed solution or a dispersion liquid of a polymer and a low-molecular material that is the material of the hole transport layer 16A2 may be arranged on an exposed surface of the hole injection layer 16A1 by, for example, an inkjet method. Afterward, the hole transport layer 16A2 of each of the red light-emission device 10R and the green light-emission device 10G is formed by a heat treatment (a dry treatment).

In the heat treatment, the solvent or the dispersion liquid is heated at a high temperature after being dried. An atmosphere for coating and an atmosphere for drying and heating may be preferably an atmosphere including nitrogen (N2) as a main component. When oxygen or moisture is present, light emission efficiency and life of the fabricated display unit 1 may decrease. In particular, in a heating step, influence of oxygen and moisture is large and thus it is necessary to pay attention. An oxygen density may be preferably 0.1 ppm or more and 100 ppm or less, and more preferably 50 ppm or less. When the oxygen exceeding 100 ppm is present, an interface of a formed thin film may be contaminated, which may decrease the light emission efficiency and the life of the obtained display unit 1. Further, there is no disadvantage in terms of device characteristics when the oxygen density is less than 0.1 ppm. However, cost of a device that maintains an atmosphere at 0.1 ppm or less may become large, in an existing mass production process.

Further, as for the moisture, a dew point may be preferably, for example, −80° C. or higher and −40° C. or lower. Furthermore, the dew point may be more preferably −50° C. or lower, and still more preferably −60° C. or lower. If the moisture higher than −40° C. is present, an interface of the formed thin film may be contaminated, which may decrease the light emission efficiency and the life of the obtained display unit 1. Further, there is no disadvantage in terms of device characteristics, when the moisture is lower than −80° C. However, cost of a device that maintains an atmosphere at −80° C. or lower may become large, in an existing mass production process.

A heating temperature may be preferably 100° C. to 230° C., and more preferably 100° C. to 200° C. Preferably, the heating temperature may be at least lower than a temperature at the time when the hole injection layer 16A1 is formed. Duration may be preferably about 5 minutes to about 300 minutes, and more preferably 10 minutes to 240 minutes, depending on the temperature and atmospheric condition. A film thickness after drying may be preferably 10 nm to 200 nm, depending on the overall configuration of the device. Furthermore, the film thickness after drying may be more preferably 15 nm to 150 nm.

[Process of Forming Red Light Emitting Layer 16BR and Green Light Emitting Layer 16BG]

After the hole transport layer 16A2 of each of the red light-emission device 10R and the green light-emission device 10G is formed, the red light emitting layer 16BR made of the phosphor host material containing the phosphor dopant as described above is formed on the hole transport layer 16A2 of the red light-emission device 10R. In addition, the green light emitting layer 16BG made of the phosphor host material containing the phosphor dopant is formed on the hole transport layer 16A2 of the green light-emission device 10G. The red light emitting layer 16BR and the green light emitting layer 16BG are formed by a coating method such as a spin coating method and a droplet discharge method. In particular, it may be preferable to use an inkjet method that is a droplet discharge method, or a nozzle coating method, since it is necessary to arrange the material of each of the red light emitting layer 16BR and the green light emitting layer 16BG selectively in a region surrounded by the upper partition 15B.

Specifically, a solvent in which xylene and cyclohexylbenzene are mixed at a ratio of 2:8 is prepared. The phosphor host material, which is the material of each of the red light emitting layer 16BR and the green light emitting layer 16BG, is doped with 1 wt % of the phosphor dopant, and then dissolved in the solvent. This results in a mixed solution or dispersion liquid. The mixed solution or the dispersion liquid may be arranged on an exposed surface of the hole transport layer 16A2 by, for example, an inkjet method. Afterward, the red light emitting layer 16BR and the green light emitting layer 16BG are formed by performing a heat treatment using a method and conditions similar to those in the heat treatment (the dry treatment) described above for the process of forming the hole transport layer 16A2 of the red light-emission device 10R and the green light-emission device 10G.

[Process of Forming Hole Transport Layer 16A2 of Blue Light-Emission Device 10B and Cyan Light-Emission Device 10C]

After the red light emitting layer 16BR and the green light emitting layer 16BG are formed, the hole transport layer 16A2 made of the low-molecular material described above is formed on the hole injection layer 16A1 for the blue light-emission device 10B and the cyan light-emission device 10C. The hole transport layer 16A2 is formed by a coating method such as a spin coating method and a droplet discharge method. In particular, it may be preferable to use an inkjet method that is a droplet discharge method, or a nozzle coating method, since it is necessary to arrange the material of the hole transport layer 16A2 selectively in a region surrounded by the upper partition 15B.

Specifically, a low-molecular solution or dispersion liquid that is the material of the hole transport layer 16A2 may be arranged on an exposed surface of the hole injection layer 16A1 by, for example, an inkjet method. Afterward, the hole transport layer 16A2 is formed by a heat treatment using a method and conditions similar to those in the heat treatment (the dry treatment) described above for the process of forming the hole transport layer 16A2 of the red light-emission device 10R and the green light-emission device 10G.

[Order of Processes]

The process of forming the hole transport layer 16A2 of the red light-emission device 10R and the green light-emission device 10G, the process of forming the hole transport layer 16A2 of the blue light-emission device 10B and the cyan light-emission device 10C, and the process of forming the red light emitting layer 16BR and the green light emitting layer 16BG may be performed in any order. However, preferably, at least a base for development of a layer to be formed may have been formed in advance, and a heating step of heating and drying steps may have been completed. Further, coating may be preferably performed such that a temperature in the heating step is at least equal to or lower than a temperature in the preceding step. For example, assume that the heating temperature for the red light emitting layer 16BR and the green light emitting layer 16BG is 130° C., and the heating temperature for the hole transport layer 16A2 for the blue light-emission device 10B and the cyan light-emission device 10C is also 130° C. In this case, coating may be performed for the red light emitting layer 16BR and the green light emitting layer 16BG, and then, without performing drying, coating may be performed for the hole transport layer 16A2 for the blue light-emission device 10B and the cyan light-emission device 10C. Subsequently, drying and heating steps may be performed, for the red light emitting layer 16BR, the green light emitting layer 16BG, and the hole transport layer 16A2 for the blue light-emission device 10B and the cyan light-emission device 10C.

It is to be noted that, assume that the hole transport layer 16A2 of the red light-emission device 10R and the green light-emission device 10G and the hole transport layer 16A2 of the blue light-emission device 10B and the cyan light-emission device 10C are made of the same material and formed to have a uniform thickness. In this case, the hole transport layer 16A2 may be formed in one step as a common layer on the entire surface within the region by using a method such as a slit coating method, as described above. This makes it possible to reduce the number of processes. Specifically, the hole transport layer 16A2 is formed as a common layer on the entire surface on the hole injection layer 16A1 on the light-emission devices 10R, 10G, 10G, and 10C, by using a coating method such as a slit coating method. Afterword, a heat treatment using a method and conditions similar to those in the heat treatment (the dry treatment) described above for the process of forming the hole transport layer 16A2 is performed. Subsequently, the red light emitting layer 16BR and the green light emitting layer 16BG are formed in the manner described above.

Furthermore, it may be preferable to perform drying and heating as different steps, in each of the above-described processes. This is because, in the drying step, an applied wet film is very likely to move, which may easily develop film unevenness. A preferable drying step may use a method of performing uniform vacuum drying at normal pressure. Further, drying without blowing during the drying may be preferable. In the heating step, flowability decreases to some extent as a solvent is vaporized, and thus the film is cured. The film is thereafter gradually heated, which makes it possible to remove a small amount of remaining solvent, and to cause molecular-level rearrangement of the light emission material or the material of the hole transport layer.

[Process of Forming Blue Light Emitting Layer 16BB]

After the red light emitting layer 16BR, the green light emitting layer 16BG, and the hole transport layers 16A2 for the blue light-emission device 10B and the cyan light-emission device 10C are formed, the blue light emitting layer 16BB made of the low-molecular material described above is formed as a common layer on each of the light-emission devices 10R, 10G, 10B, and 10C by vapor deposition.

[Process of Forming Electron Transport Layer 16C1, Electron Injection Layer 16C2, and Counter Electrode 17]

After the blue light emitting layer 16BB is formed, the electron transport layer 16C1, the electron injection layer 16C2, and the counter electrode 17 made of the materials described above are formed on the entire surface of the blue light emitting layer 16BB, by vapor deposition.

After the counter electrode 17 is formed, the protective layer 30 may be formed by a film formation method in which film formation particle energy is small, e.g., vapor deposition or a CVD method, to the extent of having no influence on the base. For example, when the protective layer 30 made of amorphous silicon nitride is formed, a film having a thickness of 2 μm to 3 μm may be formed by the CVD method. In this case, it may be desirable to set a film formation temperature at the ambient temperature, for prevention of a decline in luminance due to deterioration of the organic layer 16. It may be also desirable to form the film under a condition of minimizing stress on the film, for prevention of peeling off of the protective layer 30.

The blue light emitting layer 16BB, the electron transport layer 16C1, the electron injection layer 16C2, the counter electrode 17, and the protective layer 30 are each formed on the entire surface as a continuous film without using a minute mask. In addition, desirably, the blue light emitting layer 16BB, the electron transport layer 16C1, the electron injection layer 16C2, the counter electrode 17, and the protective layer 30 may be formed in succession in the same film formation apparatus without being exposed to the air. This prevents the organic layer 16 from deteriorating due to moisture in the air.

It is to be noted that, when an auxiliary electrode (not illustrated) is formed in the same process as the processing of forming the pixel electrode 14, the organic layer 16 formed on the auxiliary electrode as a continuous film may be removed by a technique such as laser ablation, before the counter electrode 17 is formed. This makes it possible to connect the counter electrode 17 directly to the auxiliary electrode, thereby improving contact.

After the protective layer 30 is formed, the black matrix 41 made of the material described above may be formed, for example, in a grid, on the counter substrate 40 made of the material described above to correspond to each of the light-emission devices 10R, 10G, 10B, and 10C. Subsequently, the material of the red filter 42R is applied to the counter substrate 40 by, for example, spin coating. The applied material is patterned by a photolithography technique and then subjected to firing, to form the red filter 42R. Subsequently, the color filter layer 42 is formed by sequentially forming the green filter 42G and the blue filter 42B in a manner similar to that of the red filter 42R. At this moment, in the present embodiment, the opening 42A provided with none of the filters is formed at a position corresponding to the cyan light-emission device 10C.

Afterward, a bonding layer (not illustrated) is formed on the protective layer 30, and the counter substrate 40 is adhered with this bonding layer interposed therebetween. This completes the display unit 1 illustrated in FIG. 1.

[1-3. Overall Configuration]

FIG. 4 illustrates an overall configuration of the display unit 1 illustrated in FIG. 1. As described above, the display region 110 is provided on the drive substrate 11. In the display region 110, the plurality of pixels 5 each provided with the red pixel 5R, the green pixel 5G, and the blue pixel 5B are arranged in a matrix. On a peripheral region thereof, for example, a signal-line driving circuit 120 and a scanning-line driving circuit 130 each serving as a driver for image display may be provided. It is to be noted that the blue pixel 5B includes the blue pixel 5BB and a cyan pixel 5BC that are each driven independently.

The pixel driving circuit 140 is provided within the display region 110. FIG. 5 illustrates an example of the pixel driving circuit 140. The pixel driving circuit 140 is an active drive circuit formed in a layer below the pixel electrode 14 to be described later. In other words, the pixel driving circuit 140 has the drive transistor Tr1 and a write transistor Tr2, and a capacitor (a retention capacitor) Cs between the transistors Tr1 and Tr2. The pixel driving circuit 140 further has the red light-emission device 10R (or the green light-emission device 10G, the blue light-emission device 10B, or the cyan light-emission device 10C) coupled in series to the drive transistor Tr1, between a first power source line (Vcc) and a second power source line (GND). The drive transistor Tr1 and the write transistor Tr2 each includes a typical thin-film transistor (TFT), and may each have, but not limited to, an inverted staggered structure (a so-called bottom-gate type) or a staggered structure (a top-gate type), for example.

In the pixel driving circuit 140, a plurality of signal lines 120A are arranged in a column direction, and a plurality of scanning lines 130A are arranged in a row direction. An intersection of each of the signal lines 120A and each of the scanning lines 130A corresponds to any one (a sub-pixel) of the red light-emission device 10R (the red pixel 5R), the green light-emission device 10G (the green pixel 5G), the blue light-emission device 10B (the blue pixel 5BB), and the cyan light-emission device 10C (the cyan pixel 5BC). Each of the signal lines 120A is coupled to the signal-line driving circuit 120, and an image signal is supplied from the signal-line driving circuit 120 to a source electrode of the write transistor Tr2 through the signal line 120A. Each of the scanning lines 130A is coupled to the scanning-line driving circuit 130, and a scanning signal is sequentially supplied from the scanning-line driving circuit 130 to a gate electrode of the write transistor Tr2 through the scanning line 130A.

Further, in the display region 110, the red light-emission device 10R displaying red color, the green light-emission device 10G displaying green color, the cyan light-emission device 10C displaying cyan color, and the blue light-emission device 10B displaying blue color are sequentially arranged in a matrix as a whole. It is to be noted that the colors displayed by the red light-emission device 10R, the green light-emission device 10G, and the cyan light-emission device 10C are the light emitted by the light emitting layers 16BR, 16BG, and 16BB, respectively. As for the color (blue) displayed in the blue light-emission device 10B, light having a wavelength region of 400 nm to 470 nm is selectively extracted from the light emitted in the light emitting layer 16BB by allowing the blue filter 42B to pass therethrough.

In the display unit 1, a scanning signal is supplied from the scanning-line driving circuit 130 to each of the pixels through the gate electrode of the write transistor Tr2, and an image signal supplied from the signal-line driving circuit 120 is retained at the capacitor Cs through the write transistor Tr2. In other words, the drive transistor Tr1 is controlled to be ON/OFF according to this signal retained at the capacitor Cs, and thereby a driving current Id is injected into the red light-emission device 10R, the green light-emission device 10G, the blue light-emission device 10B, and the cyan light-emission device 10C. As a result, electron-hole recombination occurs, which causes emission of light. This light passes through the pixel electrode 14 and the drive substrate 11 to be extracted, when the display unit 1 is of an undersurface light emission type (a bottom emission type). On the other hand, this light passes through the counter electrode 17, the color filter layer 42, and the counter substrate 40 to be extracted, when the display unit 1 is of a top-surface light emission type (a top emission type).

As described above, in a typical organic EL display unit including a plurality of light-emission devices that emit red, green, and blue light, light emission efficiency decreases when a color gamut is deepened by placing importance on chromaticity. In particular, when a color gamut of blue is deepened, an influence thereof is large, and therefore power consumption greatly increases to have luminance of light emission efficiency in a substantially same level as that of light emission efficiency before the deepening. In this way, there is a trade-off relation between deepening of a color gamut, and luminous efficiency as well as power consumption.

In contrast, in the present embodiment, the opening 42A is provided in a region of the blue filter 42B provided at the position corresponding to a sub-pixel (a color pixel; here, for example, the blue pixel 5R) of a color for which a color gamut is desired to be deepened. Hence, of the light (blue light) emitted in the blue pixel 5B, light in a corresponding wavelength region is selectively extracted to outside by the blue filter 42B, and that light is extracted from the opening 42A to outside without a reduction in the quantity of the light. The display unit 1 is therefore able to improve light extraction efficiency, and to incorporate light of color other than trichromaticity (R, G, and B).

Here, a comparison between the display unit 1 in the present embodiment and an organic EL display unit having a typical configuration is made in terms of panel-power-consumption burden ratio when corresponding to a DCI color gamut. The DCI color gamut is a standard with a wide color gamut developed for digital cinema, and has a color gamut wider than that of an existing apparatus oriented to digital television. Efforts have been made to adapt displays supporting a wider color gamut to the DCI color gamut. A panel-consumption-current burden ratio corresponding to the DCI color gamut is calculated as follows. An adjustment is made in advance using a color filter in such a manner that chromaticity of each of pixels of primary colors (R, G, and B) corresponds to a DCI chromaticity point. The panel-consumption-current burden ratio is then calculated based on luminance distributed to each of the pixels, when color of a target chromaticity point is expressed. A comparison is made by integrating respective current ratios in a case where a plurality of photograph files are displayed, and then calculating an average value for performing display of a standard image signal. When the panel-power-consumption burden ratio in each of the color pixels (R, G, and B) is calculated using the above-described calculation method, the following results are obtained. For a red pixel (R), a green pixel (G), and a blue pixel (B), 31%, 24%, and 45%, respectively, are obtained in the typical organic EL display unit, whereas 38%, 30%, and 32% (of these, the blue pixel 5BB; 5%, and the cyan pixel 5BC; 27%), respectively, are obtained in the display unit 1 of the present embodiment. In other words, it is appreciated that it is possible to reduce the power consumption by about 20%, as compared with the power consumption of the typical organic EL display unit.

As described above, in the display unit 1 of the present embodiment, for example, the opening 42A may be provided in a region of the color filter layer 42 (the blue filter 42B) provided at the position facing the blue pixel 5B. This makes it possible, in the blue pixel 5B, to extract, from the opening 42A, a quantity of light emitted from the blue light emitting layer 16BB without being reduced, while extracting original blue light from the region where the blue filter 42B is provided. It is therefore possible to improve light extraction efficiency, and to incorporate light of color other than trichromaticity (R, G, and B). In other words, it is possible to provide the display unit 1 having a wide color gamut while suppressing power consumption, and an electronic apparatus with the display unit 1.

It is to be noted that, in the above-described embodiment, the opening 42A is provided in the color filter layer 42 at the position corresponding to the cyan light-emission device 10C in the blue pixel 5B. However, the transparent resin layer made of the transparent resin material may be provided as described above, or a blue filter having a thickness less than that of the blue filter 42B may be provided.

Moreover, in the present embodiment, the invention has been described using the blue pixel 5B as an example of a pixel corresponding to the first pixel. However, without being limited to this example, a structure of the invention may be applied to the red pixel 5R or the green pixel 5G. In application to the red pixel 5R, the red light emitting layer 16BR may preferably include a material that emits orange light in a wavelength region of 560 nm to 620 nm, for example. Examples of a specific material may include iridium complex materials that are phosphor light emission materials. In application to the green pixel 5G, the green light emitting layer 16BG may preferably include a material that emits yellowish green light in a wavelength region of 520 nm to 600 nm, for example. Examples of a specific material may include iridium complex materials that are phosphor light emission materials.

A second embodiment and a modification example will be described below. It is to be noted that the same components as those of the first embodiment are provided with the same reference numerals as those of the first embodiment, and description thereof will be omitted.

2. Second Embodiment

FIG. 6 illustrates an example of a cross-sectional configuration of a display unit 2 according to a second embodiment of the disclosure. The display unit 2 may be used, for example, as an organic EL television apparatus, and for example, the display region 110 may be provided on the drive substrate 11, as with the first embodiment. Within the display region 110, for example, a plurality of pixels 6 each including three color pixels (sub-pixels) may be arranged in a matrix. In the present embodiment, the pixels 6 include two kinds of pixels (a pixel 6M and a pixel 6N). The pixel 6M and the pixel 6N have color arrangements different from each other. The pixels 6M and the pixels 6N are alternately arranged in a so-called checkered pattern within the display region 110. As for a color-pixel configuration of the pixel 6M and the pixel 6N, the pixel 6M may include, for example, a red pixel 6R, a green pixel 6G, and a blue pixel 6B, whereas the pixel 6N may include, for example, the red pixel 6R, a yellow pixel 6Y, and the blue pixel 6B. In other words, the display unit 2 in the present embodiment is allowed to perform four-color display in a configuration of three sub-pixels per pixel, by combining the two kinds of pixels, i.e., the pixel 6M and the pixel 6N having the different color arrangements. The four-color display is usually implemented in a configuration of four sub-pixels per pixel.

The light-emission device 10 of the display unit 2 may have, for example, a configuration similar to that in the above-described first embodiment. In this configuration, for example, a hole supply layer 26A (a hole injection layer 26A1 and a hole transport layer 26A2), a light emitting layer 26B, and an electron supply layer 26C (an electron injection layer 26C21 and an electron transport layer 26C1) may be stacked to form an organic layer 26, between the pixel electrode 14 and the counter electrode 17.

FIGS. 7A, 7B, and 7C schematically illustrate a configuration of each of the light emitting layer 26B in FIG. 7A, a color region (a color filter layer) 42 in FIG. 7B, and display light in FIG. 7C, in each of color pixels 6MR (=6M1), 6MG (=6M2), 6MB (=6M3), 6NR (=6N1), 6NY (=6N2), and 6NB (=6N3) of the pixel 6M and the pixel 6N, in the display unit 2 (a display unit 2A) illustrated in FIG. 1.

A red light emitting layer 26BR and a yellow light emitting layer 26BY of each of the pixel 6M and the pixel 6N are independently colored for each of the color pixels 6MR, 6MG, 6NR, and 6NY, as with the red light emitting layer 16BR and the green light emitting layer 16BG of the display unit 1 described above. A blue light emitting layer 26BB is provided as a layer common to the pixel 6M (the color pixels 6MR, 6MG, and 6MB) and the pixel 6N (the color pixels 6NR, 6NY, and 6NB), as with the configuration illustrated in FIG. 1.

The color filter layer 42 of the pixel 6M and the pixel 6N includes color filter layers 42R, 42G, and 42B of colors corresponding to the color pixels 6MR, 6MG, 6MB, 6NR, 6NY, and 6NB. Here, in the color filter layer 42 at the position corresponding to the yellow pixel 6NY, an opening 42H may be provided as in the display unit 1, or a transparent resin layer 42N made of a transparent resin material having a light transmitting property may be provided as illustrated in diagrams such as FIG. 6. Alternatively, a yellow color filter may be provided. In this case, however, it may be preferable to provide an optical transmittance higher than those of the other color filters by providing a film thickness smaller than those of the other color filters.

As illustrated in FIG. 7C, providing such a configuration allows the two pixels 6M and 6N each including the three color pixels to achieve four-color emission light (display light) of red (R), green (G), blue (B), and yellow (Y), in the display unit 2 of the present embodiment.

It is to be noted that the configuration of the light emitting layer 26B and the configuration of the color filter layer 42 in each of the color pixels in the present embodiment are not limited. For example, the following configurations may be adopted.

FIGS. 8A and 8B schematically illustrate a configuration of each of the light emitting layer 26B in FIG. 8A, the color filter layer 42 in FIG. 8B, and the display light in FIG. 8C, in each of the color pixels (6M1, 6M2, 6M3, 6N1, 6N2, and 6N3) of the pixel 6M and the pixel 6N, in a display unit 2B according to the present embodiment.

As the light emitting layer 26B provided in the pixel 6M and the pixel 6N, for example, as illustrated in FIG. 8A, the yellow light emitting layer 26BY common to two adjacent color pixels (e.g., the color pixels 6M1 and 6M2, as well as the color pixels 6N1 and 6N2) may be provided, whereas the blue light emitting layer 26BB may be provided in the remaining one pixel (e.g., the color pixel 6M3, and the color pixel 6N3). It is to be noted that the blue light emitting layer 26BB may be provided as a layer common to all the color pixels (6M1, 6M2, 6M3, 6N1, 6N2, and 6N3) of each of the pixels, as with the configuration illustrated in FIG. 1.

The color filter layer 42 of the pixel 6M and the pixel 6N may be provided, for example, in a manner illustrated in FIG. 8B. Specifically, for example, the transparent resin layer 42N may be provided in the color pixel 6M1, the green filter 42G may be provided in the color pixel 6M2, and the blue filter 42B may be provided in the color pixel 6M3. Further, the red filter 42R may be provided in the color pixel 6N1, the transparent resin layer 42N may be provided in the color pixel 6N2, and the blue filter 42B may be provided in the color pixel 6N3.

Such a configuration makes it possible to obtain the following color light, in the display unit 2B of the present embodiment. As illustrated in FIG. 8C, yellow light (Y) is obtained in the color pixel 6M1, green light (G) is obtained in the color pixel 6M2, and blue light (B) is obtained in the color pixel 6M3. Further, red light (R) is obtained in the color pixel 6N1, yellow light (Y) is obtained in the color pixel 6N2, and blue light (B) is obtained in the color pixel 6N3. In this way, the two pixels 6M and 6N make it possible to obtain four-color emission light (display color) of red (R), green (G), blue (B), and yellow (Y).

Moreover, in the present embodiment, it is possible to obtain not only four-color emission light per two pixels, but also five-color emission light per two pixels, by appropriately selecting a combination of the light emitting layer 26B and the color filter layer 42 that are provided in each of the color pixels (6M1, 6M2, 6M3, 6N1, 6N2, and 6N3) of the pixel 6M and the pixel 6N. An example thereof will be described below.

FIGS. 9A, 9B and 9C schematically illustrate a configuration of each of the light emitting layer 26B in FIG. 9A, the color region (the color filter layer) 42 in FIG. 9B, and the display light in FIG. 9C, in each of the color pixels (6M1, 6M2, 6M3, 6N1, 6N2, and 6N3) of the pixel 6M and the pixel 6N, in a display unit 2C according to the present embodiment As the light emitting layer 26B provided in the pixel 6M and the pixel 6N, for example, as illustrated in FIG. 9A, the yellow light emitting layer 26BY common to two adjacent color pixels (e.g., the color pixels 6M1 and 6M2, as well as the color pixels 6N1 and 6N2) may be provided, whereas the cyan light emitting layer 26BB may be provided in the remaining one pixel (e.g., the color pixel 6M3 and the color pixel 6N3). It is to be noted that the blue light emitting layer 26BB may be provided as a layer common to all the color pixels (6M1, 6M2, 6M3, 6N1, 6N2, and 6N3) of each of the pixels, as with the configuration illustrated in FIG. 1.

The color filter layer 42 of the pixel 6M and the pixel 6N may be provided, for example, as illustrated in FIG. 9B. Specifically, for example, the transparent resin layer 42N may be provided in the color pixel 6M1, the green filter 42G may be provided in the color pixel 6M2, and the blue filter 42B may be provided in the color pixel 6M3. Further, the red filter 42R may be provided in the color pixel 6N1, and the transparent resin layer 42N may be provided in each of the color pixel 6N2 and the color pixel 6N3.

Such a configuration makes it possible to obtain the following color light, in the display unit 2C of the present embodiment. As illustrated in FIG. 9C, yellow light (Y) is obtained in the color pixel 6M1, green light (G) is obtained in the color pixel 6M2, and blue light (B) is obtained in the color pixel 6M3. Further, red light (R) is obtained in the color pixel 6N1, yellow light (Y) is obtained in the color pixel 6N2, and cyan light (C) is obtained in the color pixel 6N3. In this way, the two pixels 6M and 6N make it possible to obtain five-color emission light (display color) of red (R), green (G), blue (B), yellow (Y), and cyan (C).

It is considered that, in an organic EL display unit, yellow light (Y) and cyan (Y) may be used, besides red light (R), green light (G), and blue light (B), to improve luminance or to reduce power consumption, for example. It is conceivable that, in a typical organic EL display unit, four-pixel driving of RGBY may be performed in a case where, for example, Y is added to RGB, as described above. The pixel referred to here is a color pixel. When such four-pixel driving is adopted, the number of color pixels increases by one for each of pixels, thereby increasing the number of the pixels in the entire display unit. This complicates a manufacturing process, thereby leading to an increase in cost, which is a problem.

In contrast, in the present embodiment, in the two pixels (the pixel 6M and the pixel 6N), at least one pair of corresponding color-pixels that correspond to the color arrangement configurations of the color filter layer 42 may be different from each other in optical transmittance. The color filter layer 42 may have the color arrangement configurations in units of the color pixels at positions corresponding to the color pixels 6M1, 6M2, and 6M3 that configure the pixel 6M and the color pixels 6N1, 6N2, and 6N3 that configure the pixel 6N. Specifically, for example, the red filter 42R may be provided for each of the color pixels 6M1 and 6N1, and the blue filter 42B may be provided for each of the color pixels 6M3 and 6N3, whereas the green filter 42 may be provided for the color pixel 6M2, and a colorless color filter made of the transparent resin layer 42N may be provided for the color pixel 6N2. This makes it possible to extract color light of four colors by using the two pixels (the pixel 6M and the pixel 6N) each including the three color pixels, and to incorporate color light other than trichromaticity (R, G, and B). Further, a colorless color filter is provided for one of the color pixels (for example, the transparent resin layer 42N in the color pixel 6N2). This makes it possible to extract the corresponding emission light to outside, without a reduction in the quantity of light emitted from the corresponding emission light.

As described above, the display unit 2 in the present embodiment has the following configuration. In the two pixels (the pixel 6M and the pixel 6N), at least one pair of corresponding color-pixels that correspond to the color arrangement configurations of the color filter layer 42 may be different from each other in optical transmittance. The color filter layer 42 may have the color arrangement configurations in units of the color pixels at positions corresponding to the color pixels 6M1, 6M2, and 6M3 that configure the pixel 6M and the color pixels 6N1, 6N2, and 6N3 that configure the pixel 6N. For example, one of the color filters may be colorless. This makes it possible to improve efficiency of light extraction to outside, and to perform display using color light other than trichromaticity (R, G, and B). It is therefore possible to provide a display unit having a wide color gamut while suppressing power consumption, and an electronic apparatus with the display unit.

3. Modification Example

FIG. 10 schematically illustrates a partial plan view of a display unit 3 in which a plurality of pixels are arranged in a matrix, as with the display units 1 and 2 respectively described in the first embodiment and the second embodiment above. It is to be noted that, as for a light-emission device provided for each of the pixels, a color filter of corresponding color is assumed to be provided on the light-emission device of each color, as in the above-described embodiments. The display unit 3 may be designed as follows. In some of the pixels arranged in a matrix, for example, one (a pixel X) of the pixels arranged to be 3×3 in a row direction and a column direction as illustrated in FIG. 10, a color filter may not be provided, or a color filter having a thickness less than those of other pixels may be provided. FIGS. 11A and 11B illustrate luminance per unit area in a display unit. A horizontal axis indicates chroma (S), and a vertical axis indicates lightness (V). As compared with a typical display unit in FIG. 11A, the display unit 3 in FIG. 11B according to the present modification example has an improvement in luminance per unit area.

APPLICATION EXAMPLES

Application examples of the display units (the display units 1, 2, and 3) described in the first and second embodiments and the modification example will be described below. The display unit of any of the above-described embodiments is applicable to display units of electronic apparatuses in various fields that display externally-inputted image signals or internally-generated image signals, as a still image or a moving image. Examples of the electronic apparatuses may include television apparatuses, digital cameras, laptop personal computers, mobile terminals such as mobile phones, and video cameras. In particular, application to a large-sized display produces a greater effect. Examples thereof will be described below.

Application Example 1

FIGS. 12A and 12B each illustrate an appearance of a tablet personal computer according to an application example 1. This tablet personal computer may have, for example, a housing 620 in which a display section 610 and an operation section 630 are disposed. The display section 610 is equipped with any of the display units 1, 2, and 3 according to the above-described embodiments and the like.

Application Example 2

FIG. 13 illustrates an appearance of a television apparatus according to an application example 2. This television apparatus may have, for example, an image-display screen section 300 including a front panel 310 and a filter glass 320. The image-display screen 300 corresponds to any of the display units 1, 2, and 3 according to the above-described embodiments and the like.

Application Example 3

FIGS. 14A and 14B each illustrate an appearance of a digital camera to which any of the display units 1, 2, and 3 according to the above-described embodiments and the like is applied. This digital camera may have, for example, a light-emission section 410 for flash, a display section 420, a menu switch 430, and a shutter button 440. The display section 420 is configured of any of the display units 1, 2, and 3 according to the above-described embodiments and the like.

Application Example 4

FIG. 15 illustrates an appearance of a laptop personal computer to which any of the display units 1, 2, and 3 according to the above-described embodiments and the like is applied. This laptop personal computer may have, for example, a main body 510, a keyboard 520 for operation of inputting information such as characters, and a display section 530 that displays images. The display section 530 is configured of any of the display units 1, 2, and 3 according to the above-described embodiments and the like.

Application Example 5

FIG. 16 illustrates an appearance of a video camera to which any of the display units 1, 2, and 3 according to the above-described embodiments and the like is applied. This video camera may have, for example, a main body 610, a lens 620 provided on a front side face of the main body 610 to take an image of a subject, a start/stop switch 630 used during image-taking, and a display section 640. The display section 640 is configured to any of the display units 1, 2, and 3 according to the above-described embodiments and the like.

The disclosure is described above using the first and second embodiments and the modification example thereof, but the disclosure is not limited to these embodiments and the modification example, and is variously modifiable.

For example, the material and thickness, or the film formation method and film formation conditions of each of the layers described above in the embodiments and the like are not limited. Other material and thickness may be adopted, or other film formation method and film formation conditions may be adopted.

Further, in the first embodiment, the example (the display unit 1) of the display unit using cyan (C) as the fourth color other than R, G, and B is described. However, yellow (Y), for example, may be used as the fourth color. In this case, the light emitting layers 16BR, 16BG, 16BB, and 16BY in the light-emission devices 10R, 10G, 10B, and 10Y, respectively, may be formed by coloring differently for each of the light-emission devices. However, for example, the yellow light emitting layer 16BY may be formed as a layer common to the yellow light-emission device 10Y and the green light-emission device 10G, and green light in the green light-emission device 10G may be extracted by the green filter 42G, Alternatively, the yellow light emitting layer 16BY may be formed as a layer common to the yellow light-emission device 10Y, the red light-emission device 10R, and the green light-emission device 10G. In this case, red light in the red light-emission device 10R and green light in the green light-emission device 10G may be extracted by the red filter 42R and the green filter 42G, respectively. Such a configuration makes it possible to reduce the number of printing times in the manufacturing process of the organic layer 16, thereby allowing a reduction in production host.

Furthermore, in the embodiments and the like, the configuration of the light-emission devices 10R, 10G, and 10B is described referring to a specific example. However, it may not be necessary to provide all the layers, and other layer may be further provided.

Still furthermore, in the embodiments and the like, the case of the active-matrix-type display unit is described. However, the disclosure is applicable to a passive-matrix-type display unit. Moreover, the configuration of the pixel driving circuit for active matrix driving is not limited to the configurations described above in the embodiments and the like. A capacitor and a transistor may be added as necessary. In this case, a necessary drive circuit other than the signal-line driving circuit 120 and the scanning-line driving circuit 130 described above may be added according to a change in the pixel driving circuit.

In addition, in the first embodiment, the hole injection layer 16A1, the hole transport layer 16A2, the red light emitting layer 16BR, and the green light emitting layer 16BG are formed using the nozzle coating method among coating methods. However, the coating method is not limited thereto, and a spin coating method, an inkjet method, or a slit coating method may be used. Furthermore, these layers may be formed using, for example, a discharge method of directly drawing on each pixel or part between pixels such as a micro-syringe, or a plate method using a plate, which is represented by letterpress printing, flexographic printing, offset printing, and gravure printing.

It is to be noted that the effects described herein are mere examples without being limitative, and other effects may also be provided.

It is to be noted that the technology may adopt the following configurations.

(1) A display unit, including:
   a first pixel and a second pixel each having a light emitting layer; and
   a color filter layer disposed to face the first pixel and the second pixel, in which
   the color filter layer has a plurality of regions at a position facing at least the first pixel, the plurality of regions varying in optical transmittance.

(2) The display unit according to (1), in which the plurality of regions varying in transmittance includes a first region and a second region having a transmittance lower than a transmittance of the first region.

(3) The display unit according to (2), in which the first region includes a transparent resin material layer having a light transmitting property.

(4) The display unit according to (2) or (3), in which an opening is formed in the first region in the color filter layer.

(5) The display unit according to any one of (2) to (4), in which the color filter layer provided in the first region has a film thickness less than a film thickness in the second region.

(6) The display unit according to any one of (1) to (5), in which the first pixel has a first light emitting layer as the light emitting layer, the second pixel has a second light emitting layer as the light emitting layer, and the first light emitting layer is continuously provided as a layer common to the first pixel and the second pixel.

(7) The display unit according to any one of (1) to (6), in which the first pixel is a blue pixel.

(8) A display unit, including:
   a first pixel and a second pixel each having a plurality of sub-pixels; and
   a color filter layer disposed to face the first pixel and the second pixel, and having a plurality of color regions having an arrangement of colors in units of the sub-pixels, in which
   at least one of the sub-pixels that correspond to a color arrangement configuration of the color regions that face the first pixel is different, in optical transmittance, from corresponding one of the sub-pixels that correspond to a color arrangement configuration of the color regions that face the second pixel.

(9) The display unit according to (8), in which each of the sub-pixels of each of the first pixel and the second pixel has any one of a red light emitting layer, a yellow light emitting layer, and a blue light emitting layer.

(10) The display unit according to (8) or (9), in which each of the sub-pixels of each of the first pixel and the second pixel has any one of a yellow light emitting layer and a blue light emitting layer.
(11) The display unit according to any one of (8) to (10), in which each of the sub-pixels of each of the first pixel and the second pixel has any one of a yellow light emitting layer and a cyan light emitting layer.
(12) The display unit according to any one of (9) to (11), in which the color regions in the first pixel are red, green, and blue, and the color regions in the second pixel are red, colorless, and blue.
(13) The display unit according to any one of (10) to (12), in which the color regions in the first pixel are transparent, green, and blue, and the color regions in the second pixel are red, colorless, and blue.
(14) The display unit according to any one of (11) to (13), in which the color regions in the first pixel are colorless, green, and blue, and the color regions in the second pixel are red and colorless.
(15) The display unit according to any one of (12) to (14), in which the color region being colorless includes a transparent resin layer having a light transmitting property.
(16) The display unit according to any one of (12) to (15), in which an opening is formed in the color region being colorless.
(17) An electronic apparatus with a display unit, the display unit including:
  a first pixel and a second pixel each having a light emitting layer; and
  a color filter layer disposed to face the first pixel and the second pixel, in which
  the color filter layer has a plurality of regions at a position facing at least the first pixel, the plurality of regions varying in optical transmittance.
(18) An electronic apparatus with a display unit, the display unit including:
  a first pixel and a second pixel each having a plurality of sub-pixels; and
  a color filter layer disposed to face the first pixel and the second pixel, and having a plurality of color regions having an arrangement of colors in units of the sub-pixels, in which
  at least one of the sub-pixels that correspond to a color arrangement configuration of the color regions that face the first pixel is different, in optical transmittance, from corresponding one of the sub-pixels that correspond to a color arrangement configuration of the color regions that face the second pixel.

The present application is based on and claims priority from Japanese Patent Application No. 2014-203136 filed in the Japan Patent Office on Oct. 1, 2014, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

The invention claimed is:
1. A display unit, comprising:
  a plurality of pixels, each pixel of the plurality of pixels comprising a first sub-pixel, a second sub-pixel, and a third sub-pixel, wherein
    the first sub-pixel and the third sub-pixel have a first light emitting layer that is common to the first sub-pixel and the third sub-pixel,
    each of the first sub-pixel and the third sub-pixel has a pixel electrode and a hole supply layer,
    the first light emitting layer is adjacent to the hole supply layer of both of the first sub-pixel and the third sub-pixel,
    the second sub-pixel has a second light emitting layer, and
    the first light emitting layer extends over the second light emitting layer of the second sub-pixel; and
  a color filter layer on the first sub-pixel and the second sub-pixel, wherein
    the color filter layer comprises a plurality of regions,
    a first region of the plurality of regions is on at least the first sub-pixel,
    each of the plurality of regions has a different optical transmittance, and
    a second region of the plurality of regions other than red, green, and blue regions of the plurality of regions comprises an opening.
2. The display unit according to claim 1, wherein
  the first region has a first optical transmittance and the second region of the plurality of regions has a second optical transmittance, and
  the first optical transmittance is higher than the second optical transmittance.
3. The display unit according to claim 2, wherein the first region comprises a transparent resin material layer having a light transmitting property.
4. The display unit according to claim 2, wherein the opening corresponds to cyan sub-pixel.
5. The display unit according to claim 2, wherein
  the first region has a first film thickness and the second region has a second film thickness, and
  the first film thickness is less than the second film thickness.
6. The display unit according to claim 1, wherein the first sub-pixel is a blue sub-pixel.
7. A display unit, comprising:
  a first pixel that comprises a first plurality of sub-pixels;
  a second pixel that comprises a second plurality of sub-pixels,
  wherein each of the first pixel and the second pixel has a common light emitting layer; and
  a color filter layer on the first pixel and the second pixel, wherein
  the color filter layer comprises a first plurality of color regions,
  in the first plurality of color regions, an arrangement of colors is with respect to each sub-pixel of each of the first plurality of sub-pixels and the second plurality of sub-pixels,
  each color region of a second plurality of color regions of the first plurality of color regions faces a respective sub-pixel of the first plurality of sub-pixels,
  each color region of a third plurality of color regions of the first plurality of color regions faces a respective sub-pixel of the second plurality of sub-pixels, and
  each color region of the second plurality of color regions has an optical transmittance different from each color region of the third plurality of color regions.
8. The display unit according to claim 7, wherein each sub-pixel of each of the first plurality of sub-pixels and the second plurality of sub-pixels comprises one of a red light emitting layer, a yellow light emitting layer, or a blue light emitting layer.
9. The display unit according to claim 7, wherein each sub-pixel of each of the first plurality of sub-pixels and the second plurality of sub-pixels comprises one of a yellow light emitting layer or a blue light emitting layer.

10. The display unit according to claim 7, wherein each sub-pixel of each of the first plurality of sub-pixels and the second plurality of sub-pixels comprises one of a yellow light emitting layer or a cyan light emitting layer.

11. The display unit according to claim 8, wherein
each color region of the second plurality of color regions is one of red, green, or blue, and
each color region of the third plurality of color regions is one of red, colorless, or blue.

12. The display unit according to claim 9, wherein
each color region of the second plurality of color regions is one of transparent, green, or blue, and
each color region of the third plurality of color regions is one of red, colorless, or blue.

13. The display unit according to claim 10, wherein
each color region of the second plurality of color regions is one of colorless, green, or blue, and
each color region of the third plurality of color regions is one of red or colorless.

14. The display unit according to claim 8, wherein
a color region of the third plurality of color regions is colorless, and
the color region comprises a transparent resin layer having a light transmitting property.

15. The display unit according to claim 14, wherein the color region comprises an opening.

16. An electronic apparatus, comprising:
a display unit, wherein the display unit comprises:
a plurality of pixels, each pixel of the plurality of pixels comprising a first sub-pixel, a second sub-pixel, and a third sub-pixel, wherein
the first sub-pixel and the third sub-pixel have a first light emitting layer that is common to the first sub-pixel and the third sub-pixel,
each of the first sub-pixel and the third sub-pixel has a pixel electrode and a hole supply layer,
the first light emitting layer is adjacent to the hole supply layer of both of the first sub-pixel and the third sub-pixel,
the second sub-pixel has a second light emitting layer, and
the first light emitting layer extends over the second light emitting layer of the second sub-pixel; and
a color filter layer on the first sub-pixel and the second sub-pixel, wherein
the color filter layer comprises a plurality of regions,
a first region of the plurality of regions is on at least the first sub-pixel,
each of the plurality of regions has a different optical transmittance, and
a second region of the plurality of regions other than red, green, and blue regions of the plurality of regions comprises an opening.

17. An electronic apparatus, comprising:
a display unit, wherein the display unit comprises:
a first pixel having a first plurality of sub-pixels;
a second pixel having a second plurality of sub-pixels, wherein each of the first pixel and the second pixel has a common light emitting layer; and
a color filter layer on the first pixel and the second pixel, wherein
the color filter layer comprises a first plurality of color regions,
in the first plurality of color regions, an arrangement of colors is based on each sub-pixel of each of the first plurality of sub-pixels and the second plurality of sub-pixels,
each color region of a second plurality of color regions of the first plurality of color regions faces a respective sub-pixel of the first plurality of sub-pixels,
each color region of a third plurality of color regions of the first plurality of color regions faces a respective sub-pixel of the second plurality of sub-pixels, and
each color region of the second plurality of color regions has an optical transmittance different from each of the third plurality of color regions.

* * * * *